US009835363B2

(12) United States Patent
Xiao et al.

(10) Patent No.: US 9,835,363 B2
(45) Date of Patent: Dec. 5, 2017

(54) EVAPORATIVE HEAT TRANSFER SYSTEM

(71) Applicant: Massachusetts Institute of Technology, Cambridge, MA (US)

(72) Inventors: Rong Xiao, Houston, TX (US); Rishi Raj, Allston, MA (US); Shankar Narayanan, Chestnut Hill, MA (US); Evelyn N. Wang, Cambridge, MA (US); Ryan Enright, Whitestone, NY (US); Shalabh Chandra Maroo, Syracuse, NY (US)

(73) Assignee: Massachusetts Institute of Technology, Cambridge, MA (US)

( * ) Notice: Subject to any disclaimer, the term of this patent is extended or adjusted under 35 U.S.C. 154(b) by 306 days.

(21) Appl. No.: 14/152,120

(22) Filed: Jan. 10, 2014

(65) Prior Publication Data

US 2014/0196498 A1 Jul. 17, 2014

Related U.S. Application Data

(60) Provisional application No. 61/752,013, filed on Jan. 14, 2013.

(51) Int. Cl.
*F25B 39/02* (2006.01)
*H01L 23/427* (2006.01)
*H01L 23/473* (2006.01)

(52) U.S. Cl.
CPC ............ *F25B 39/02* (2013.01); *H01L 23/427* (2013.01); *H01L 23/473* (2013.01); *H01L 2924/0002* (2013.01)

(58) Field of Classification Search
CPC ...... F25B 39/02; F25B 39/022; H01L 23/473; H01L 23/427; H01L 2924/0002; H01L 23/46; H01L 23/42
USPC .......................... 165/104.26, 104.21; 62/524
See application file for complete search history.

(56) References Cited

U.S. PATENT DOCUMENTS

| 3,673,306 | A | 6/1972 | Kirkpatrick |
| 7,649,670 | B2 | 1/2010 | Basavanhally et al. |
| 7,948,757 | B2 * | 5/2011 | Campbell ............. H01L 23/427 165/104.33 |
| 8,659,896 | B2 * | 2/2014 | Dede ................... H01L 23/4735 165/104.33 |

(Continued)

OTHER PUBLICATIONS

Paul, B., Compilation of Evaporation Coefficients, American Rocket Society Journal, 1962, p. 1321, vol. 32.

(Continued)

*Primary Examiner* — Claire Rojohn, III
(74) *Attorney, Agent, or Firm* — Sam Pasternack; MIT Technology Licensing Office

(57) ABSTRACT

Evaporative heat transfer system. The system includes a substrate and a plurality of substantially parallel, spaced-apart ridges extending from the substrate forming vertical liquid manifolds therebetween. A nanoporous membrane is supported on the ridges and a pump delivers a dielectric fluid across the ridges. The fluid is drawn through the liquid manifolds via capillarity provided by the nanoporous membrane and evaporates to dissipate heat flux through the substrate. A preferred dielectric fluid is pentane. It is preferred that membrane porosity vary across the membrane to tailor thermal resistances to limit temperature rises.

7 Claims, 12 Drawing Sheets

(56) References Cited

U.S. PATENT DOCUMENTS

| | | | | |
|---|---|---|---|---|
| 8,867,209 | B2* | 10/2014 | Campbell | H05K 13/00 165/185 |
| 9,131,631 | B2* | 9/2015 | Joshi | G06F 1/20 |
| 2004/0104012 | A1* | 6/2004 | Zhou | H01L 23/427 165/104.26 |
| 2005/0286227 | A1* | 12/2005 | Erturk | H01L 23/427 361/702 |
| 2006/0180300 | A1* | 8/2006 | Lenehan | H01L 23/34 165/247 |
| 2007/0034356 | A1* | 2/2007 | Kenny | F04B 17/00 165/80.4 |
| 2007/0274045 | A1* | 11/2007 | Campbell | F28C 3/08 361/699 |
| 2008/0043440 | A1* | 2/2008 | Fedorov | H01L 23/427 361/700 |
| 2008/0105402 | A1* | 5/2008 | Behrens | B64C 1/40 165/41 |
| 2008/0137300 | A1* | 6/2008 | Macris | H01L 23/10 361/699 |
| 2008/0210405 | A1* | 9/2008 | Datta | F04B 17/00 165/102 |
| 2009/0151923 | A1* | 6/2009 | Fedorov | F28D 15/046 165/185 |
| 2009/0264277 | A1* | 10/2009 | Raj | B01J 21/08 502/4 |
| 2010/0103620 | A1* | 4/2010 | Campbell | H05K 7/20772 361/702 |
| 2010/0115977 | A1* | 5/2010 | Saroka | F25B 30/00 62/238.1 |
| 2010/0314093 | A1* | 12/2010 | Refai-Ahmed | F28D 15/0266 165/287 |
| 2011/0146956 | A1* | 6/2011 | Stroock | F28D 15/046 165/104.26 |
| 2013/0139998 | A1* | 6/2013 | Hayashi | H01L 23/473 165/47 |
| 2014/0326433 | A1* | 11/2014 | Kozubal | F24F 5/0035 165/59 |
| 2016/0033212 | A1* | 2/2016 | Wang | H01L 23/427 165/104.21 |

OTHER PUBLICATIONS

Bailey, W., et al., Pool boiling study on candidature of pentane, methanol and water for near room temperature cooling, 2006, Thermal and thermomechanical phenomena in electronics systems, ITHEM '06: IEEE.

Zhao, Y.H., et al., Conjugated heat transfer on a horizontal surface impinged by circular-free-surface liquid jet, International Journal Series B—Fluids and Thermal Engineering, 2002, p. 307-314, vol. 45 No. 2.

Beheim, G., et al, Deep RIE process for silicon carbide power electronics and MEMS, 2000, Cambridge University Press.

Padiyath, R., et al., Reactive ion etching of monocrystalline, polycrystalline, and amorphous silicon carbide in CF4/O2 mixtures, Applied physics letters, 1991, p. 1053-1055, vol. 58 No. 10.

Richter, C., et al., Rapid plasma etching of cubic SiC using NF3/O2 gas mixtures, Materials Science and Engineering: B, 1997, p. 160-163, vol. 46 No. 1-3.

Sugiura, J., et al., Reactive ion etching of SiC thin films using fluorinated gases, Journal of Vacuum Science & Technology B: Microelectronics and Nanometer Structures, 1986, p. 349-354, vol. 4 No. 1.

Wu, B., et al., High aspect ratio silicon etch: A review, Journal of Applied Physics, 2010, p. 051101, vol. 108 No. 5.

Okamoto, N., et al., SiC backside via-hole-process for GaN HEMT MMICs using high etch rate ICP etching, 2009.

Jordana, E., et al., Deep-UV lithography fabrication of slot waveguides sandwiched waveguides for nonlinear applications, 2007, IEEE.

Qiao, Y., et al., Block copolymer templated etching on silicon, Nano Letters, 2007, p. 464-469, vol. 7 No. 2.

Popa, A.M., et al., Fabrication of nanopore arrays and ultrathin silicon nitride membranes by block-copolymer-assisted lithography, Nanotechnology, 2009, p. 485303, vol. 20.

Segalman, R.A., Patterning with block copolymer thin films, Materials Science and Engineering : Reports, 2005, p. 191-226, vol. 48 No. 6.

Xiao, R., et al., High-flux thin film evaporation on nanostructured surfaces, Proceedings of the international Heat Transfer Conference, 2010.

Faghri, A., Heat pipe science and technology, 1995, New York: Taylor and Francis.

Anderson Jr., J.D. Fundamentals of Aerodynamics, Aerospace Science Series, 1991, New York: McGraw-Hill, Inc.

Osuga, T., et al., Hydrodynamic analysis of electroosmotic flow in capillary, Journal of the Physical Society of Japan, 1996, p. 1854-1858, vol. 65 No. 6.

Frangis, N., et al., The formation of 3C—SiC in crystalline Si by carbon implantation at 950 C and annealing—a structural study, Journal of Crystal Growth, 1997, p. 218-228, vol. 181.

Masuda, H., et al., Ordered Metal Nanohole Arrays made by a two-step replication of honeycomb structures of anodic alumina, Science, 1995, p. 1466-1468, vol. 268.

Heyderman, L., et al., High volume fabrication of customized nanopore membrane chips, microelectronic engineering, 2003, p. 206-213, vol. 67.

Wang, E.N., et al., A hybrid method for bubble geometry reconstruction in two-phase microchannels, experiments in fluids, 2006, p. 847-858, vol. 40 No. 6.

Wang, E.N., et al., Nucleation and Growth of Vapor Bubbles in a Heated Silicon Microchannel, Journal of Heat Transfer, 2004, p. 497, vol. 128 No. 4.

Zhang, L., et al., Enhanced Nucleate Boiling in Microchannels, Fifteenth IEEE International Conference on Micro Electro Mechanical Systems, 2002.

Alexander, B.R., et al., Design of a Microbreather for Two-Phase Microchannel Heat Sinks, Nanoscale and Microscale Thermophysical Engineering, 2009, p. 151-164, vol. 13 No. 3.

Xiao, R., et al., Prediction and Optimization of Liquid Propagation in Micropillar Arrays. Langmuir, 2010, p. 15070-5, vol. 26 No. 19.

Xiao, R., et al., Microscale Liquid Dynamics and the Effect on Macroscale Propagation in Pillar Arrays, Langmuir, 2011, p. 10360-4, vol. 27 No. 17.

Xiao, R., et al., Multilayer liquid spreading on superhydrophilic nanostructured surfaces, Applied Physics Letters, 2009, vol. 94 No. 19.

Chu, K.H., et al., Uni-directional spreading on asymmetric nanostructured surfaces, Nature materials, 2010, p. 413-417, vol. 9.

Wang, E.N., et al., Micromachined Jets for Liquid Impingement of VLSI Chips, Journal of microelectromechanical systems, 2004, p. 833-842, vol. 13 No. 5.

Chu, K.H., et al., Structured surfaced for enhanced pool boiling heat transfer, Applied Physics Letters, 2012, p. 241603, vol. 100.

Miljkovic, N., et al., Effect of droplet morphology on growth dynamics and heat transfer during condensation on superhydrophobic nanostructured surfaces, ACS Nano, 2012, p. 1776-1785, vol. 6 No. 2.

Chung, J.W., et al., Seamless On-Wafer Integration of Si(100) MOSFETs and GaN HEMTs, Electron Device Letters, 2009, p. 1015-1017, vol. 30 No. 10.

Lu, B., et al., High Breakdown (>1500 V) AlGaN/GaN HEMTs by Substrate-Transfer Technology, Electron Device Letters, 2010, p. 951-953, vol. 31 No. 9.

Ryu, K.K., et al., Thin-body N-face GaN Transistor Fabricated by Direct Wafer Bonding, Electron Device Letters, 2011, p. 895-897, vol. 32 No. 7.

Lee, H.S., et al., Wafer-level Heterogeneous Integration of GaN HEMTs and Si(100) MOSFETs, Electron Device Letters, 2012, p. 200-202, vol. 33 No. 2.

Ahuja, A., et al., Nanonails: A simple geometrical approach to electrically tunable superlyophobic surfaces, Langmuir, 2008, p. 9-14, vol. 24 No. 1.

(56) References Cited

OTHER PUBLICATIONS

Lobation, E.J., et al., Computation of Constant Mean Curvature Surfaces: Application to the Gas-Liquid Interface of a Pressurized Fluid on a Superhydrophobic Surface, Journal of Colloid and Interface Science, 2007, p. 184-198 vol. 314 No. 1.

Annapragada, S.R., et al., Determination of electrical resistivity in thermoelectric modules (TEMs) from module-level measurements, IEEE Trans. Comp. Pack. Tech, 2012, p. 668-676, vol. 2 No. 4.

Kumari, N., et al., Analysis of Evaporating Mist Flow for Enhanced Convective Heat Transfer, International Journal of Heat and Mass Transfer, 2010, p. 3346-3356, vol. 53.

Bula, A.J., et al., Axial steady free surface jet impinging over a flat disk with discrete heat sources, International Journal of Heat and Fluid Flow, 2000, p. 11-21, vol. 21—issue 1.

Mailly, F., et al., Anemometer with hot platinum thin film, Sensors and Actuarors A: Physical, 2001, p. 32-38, vol. 94, No. 1-2.

Mudawar, I., Assessment of high-heat-flux thermal management schemes, IEEE Transactions on Components & Packaging Technologies, 2001, p. 122-141, vol. 24, No. 2.

Bowers, M.B., et al., High-flux boiling in low-flow rate, low-pressure drop mini-channel and microchannel heat sinks, International Journal of Heat and Mass Transfer, 1994, p. 321-332, vol. 37, No. 2.

Peng, X.F., et al., Forced-convection and flow boiling heat-transfer for liquid flowing through microchannels, International Journal of Heat and Mass Transfer, 1993, p. 3421-3427, vol. 36 No. 14.

Madou, M.J, Fundamentals of Microfabrication: The Science of Miniaturization, 2002.

Bar-Cohen, A., et al., Two-Phase Thermal Transport in Microgap Channels—Theory, Experimental Results, and Predictive Relations, Microgravity Science and Technology, 2012, p. 1-15, vol. 24 No. 1.

Shaw, G.A., et al., Shape memory effect in nanoindentation of nickel-titanium thin films, Applied physics letters, 2003, p. 257, vol. 83.

Electroplating, S.a.T.N.

Naranayan, S., et al., Gas-Assisted Thin-Film Evaporation from Confined Spaces for Dissipation of High Heat Fluxes, Nanoscale and Microscale Thermophysical Engineering, 2009, p. 30-53, vol. 13 No. 1.

Kerdiles, S., et al., Low temperature deposition of nanocrystalline silicon carbide thin films, Applied Physics Letters, 2000, p. 2373, vol. 76.

Sarro, P., et al., Low-stress PECVD SiC thin films for IC-compatible microstructures, Sensors and Actuators A: Physical, 1998, p. 175-180, vol. 67 No. 1-3.

Transene Company, I, Nickel Etchants.

Berman, A.S., Free molecule transmission probabilities, J. Appl. Phys., 1965, p. 3356, vol. 36.

Caupin, F., et al., Cavitation in water: A review, C.R. Physique, 2006, p. 1000-1017, vol. 7.

Blander, M., et al., Bubble Nucleation in Liquids, Aiche Journal, 1975, p. 833-848, vol. 21 No. 5.

Carey, V.P., Liquid-Vapor Phase-Change Phenomena, 1993, Hemisphere Pub. Corp.

Ziambaras, E., et al., Phonon Knudsen flow in nanostructured semiconductor systems, Journal of Applied Physics, 2006, vol. 99 No. 5.

Sharpe, W.N., et al., Fracture strength of single-crystal silicon carbide microspecimens at 24 degrees C and 1000 degrees C, Journal of Microelectromechanical Systems, 2008, p. 244-254, vol. 17 No. 1.

Siedel, S., et al., Electric field effects during nucleate boiling from an artificial nucleation site, Experimental Thermal and Fluid Science, 2011, p. 762-771, vol. 35 No. 5.

Zagdoudi, M.C., et al., Nucleate pool boiling under DC electric field, Experimental Heat Transfer, 2001, p. 157-180, vol. 14 No. 3.

Balygin, I., Electric Strength of Liquid Dielectrics, DTIC Document, 1972.

Wang, Q., et al., Application of Au—Sn eutectic bonding in hermatic radio-frequency microelectromechanical system wafer level packaging. Journal of electronic materials, 2006, p. 425-432, vol. 35 No. 3.

Lee, P. S., et al., Saturated flow boiling heat transfer and pressure drop in silicon microchannel arrays, International Journal of Heat and Mass Transfer, 2008, p. 789-806, vol. 51 No. 3-4.

Steinke, M.E., et al., An Experimental Investigation of Flow Boiling Characteristics of Water in Parallel Microchannels, Journal of Heat and Mass Transfer, 2004, p. 518-526, vol. 126 No. 4.

Lee, J., et al., Two-phase flow in high-heat-flux micro-channel heat sink for refrigeration cooling applications: Part II—heat transfer characteristics, International Journal of Heat and Mass Transfer, 2005, p. 941-955, vol. 48 No. 5.

Bar-Cohen, A., et al., Two-phase thermal transport in microgap channels-theorgy, Experimental Results, and Predictive Relations, Microgravity Science and Technology, 2012, p. 1-15, vol. 24 No. 1.

Shou-Shing, H., et al., Subcooled convective boiling in structured surface microchannels, Journal of Micromechanics and Microengineering, 2010, p. 015027, vol. 20 No. 1.

Kosar, A., et al., Suppression of boiling flow oscillations in parallel microchannels by inlet restrictors, Journal of Heat Transfer—Transactions of the Asme, 2006, p. 251-260, vol. 128 No. 3.

Kim, S.S., et al., Thermal Performance of Carbon Nanotube Enhanced Vapor Chamber Wicks, ASME Conference Proceedings, 2010, p. 417-424.

Changsong, D., et al., A Flat Heat pipe architecture based on nanostructured titania, Journal of microelectromechanical systems, 2010, p. 876-884, vol. 19 No. 4.

Nam, Y., et al., Characterization and Modeling of the Heat Transfer Performance of Nanostructured Cu Micropost Wicks, Journal of Heat and Transfer, 2011, p. 101502-7, vol. 133 No. 10.

Hwang, G.S., et al. Multi-artery heat pipe spreader, Experiment, International Journal of Heat and Mass transfer, 2010, p. 2662-2689, vol. 53 No. 13-14.

Coso, D., et al., Enhanced Heat Transfer in Biporous Wicks in the Thin Liquid Film Evaporation and Boiling Regimes, Jouranal of Heat Transfer, 2012, p. 101501, vol. 134.

Cai, Q., et al., Design and Test of Carbon Nanotube Biwick Structure for High-Meat-Flux Phase Change Heat Transfer, Journal of Heat Transfer, 2010, p. 052403-8, vol. 132 No. 5.

Naranayan, S., et al., Experimental characterization of a micro-scale thin film evaporative cooling device, Thermal and Thermomechanical Phenomena in Electronic System, 2010 12th IEEE Intersociety Conference.

Khan, F.A., et al., High rate etching of SiC using inductively coupled plasma reactive ion etching in SF6-based gas mixtures, Applied Physics Letters, 1999, p. 2268-2270, vol. 75 No. 15.

Shah, R.K., et al., Laminar flow foreced convection in ducts, Advance in heat transfer, Supplement 1, 1978. New York: Academic Press.

Xiao, R., et al., Thin Film Evaporation using Nanoporous Membranes for Enhanced Heat Transfer, ASME Summer Heat Transfer Conference, 2012.

Incropera, F.P., et al., Fundamentals of Heat and Mass Transfer, 4 ed., 1996, New York: John Wiley and Sons.

Ziambaras, E., et al., Phonon Knudsen flow in nanostructured semiconductor systems. Journal of Applied Physics, 2006, p. 054303-11, vol. 99 No. 5.

Hopcroft, M.A., et al., What is the Young's Modulus of Silicon?, Journal of Microelectromechanical Systems, 2010, p. 229-236, vol. 19 No. 2.

Wu, J.D., et al., Fracture Strength characterization and failure analysis of silicon dies, Microelectronics Reliability, 2003, p. 269-277, vol. 43 No. 2.

Sharpe, W.N., et al., Fracture Strength of silicon carbide microspecimens, Journal of microelectromechanical systems, 2005, p. 903-913, vol. 14 No. 5.

Schrage, R.W., A thecratical study of interphase mass transfer, 1953, New York: Columbia University Press.

Fang, G., et al., Expression for predicting liquid evaporation flux: Statistical rate theory approach, Phys. Rev. E, 1989, p. 429-440, vol. 59 No. 1.

(56) References Cited

OTHER PUBLICATIONS

Xiao, R., et al., Thin Film Evaporation using nanoporous membranes for enhance heat transfer, ASME Summer Heat Transfer Conference, 2012.
Bonacci, J.C., et al., The evaporation and condensation coefficient of water, ice, and carbon tetrachloride, Chemical Engineering Science, 1976, p. 609-617, vol. 31 No. 6.
Maa, J.R., Evaporation coefficient of liquids, Industrial & Engineering Chemistry Fundamentals, 1967, p. 504-518. vol. 6 No. 4.
Marek, R., et al., Analysis of the evaporation coefficient and the condensation coefficient of water, International Journal of Heat and Mass transfer, 2001, p. 39-53, vol. 44 No. 1.
International Search Report for PCT/US2014/0111437 dated Jun. 25, 2014.

\* cited by examiner

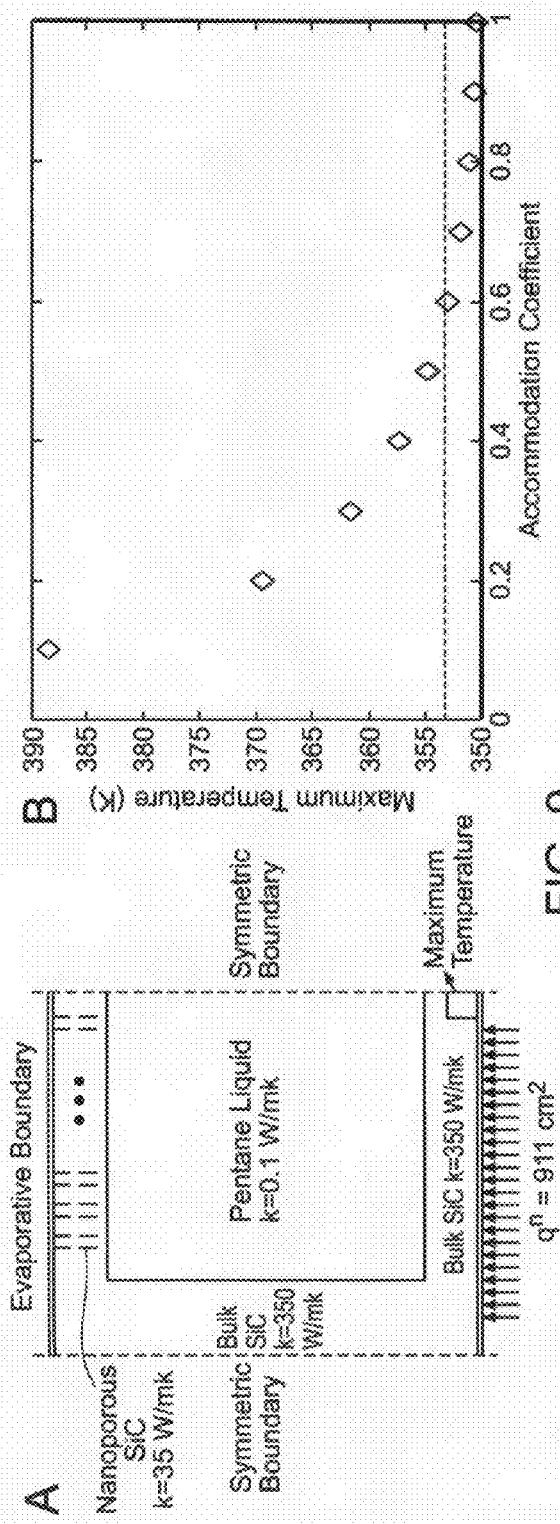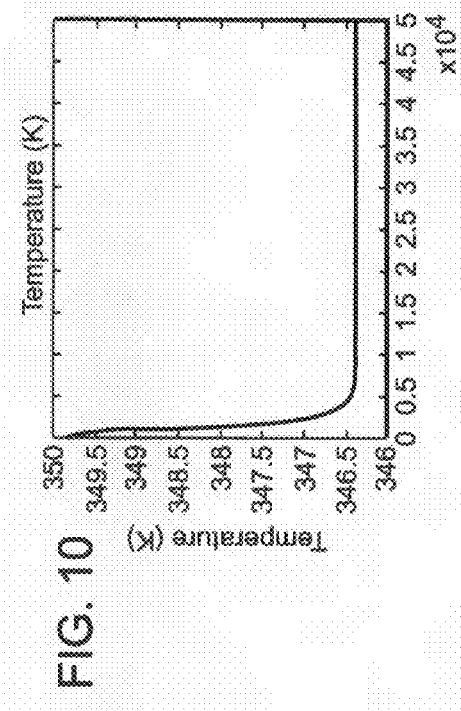
FIG. 9
FIG. 10

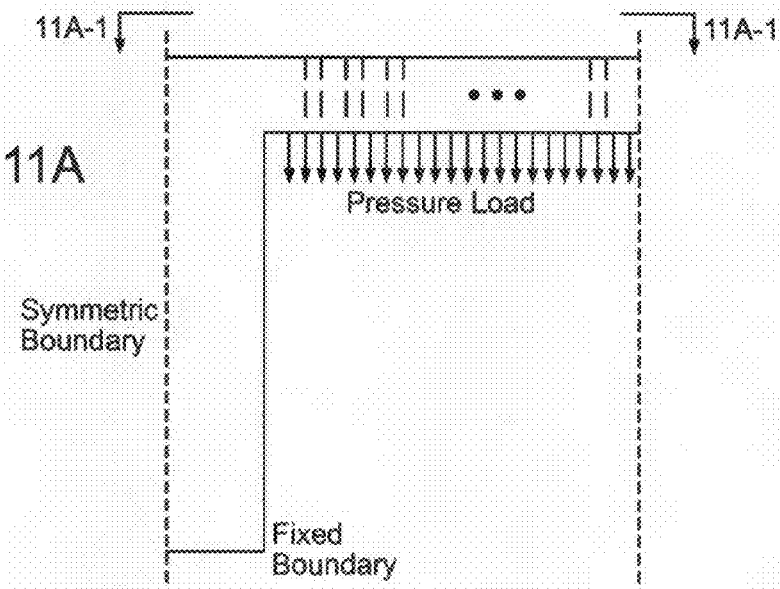
FIG. 11A
FIG. 11A-1
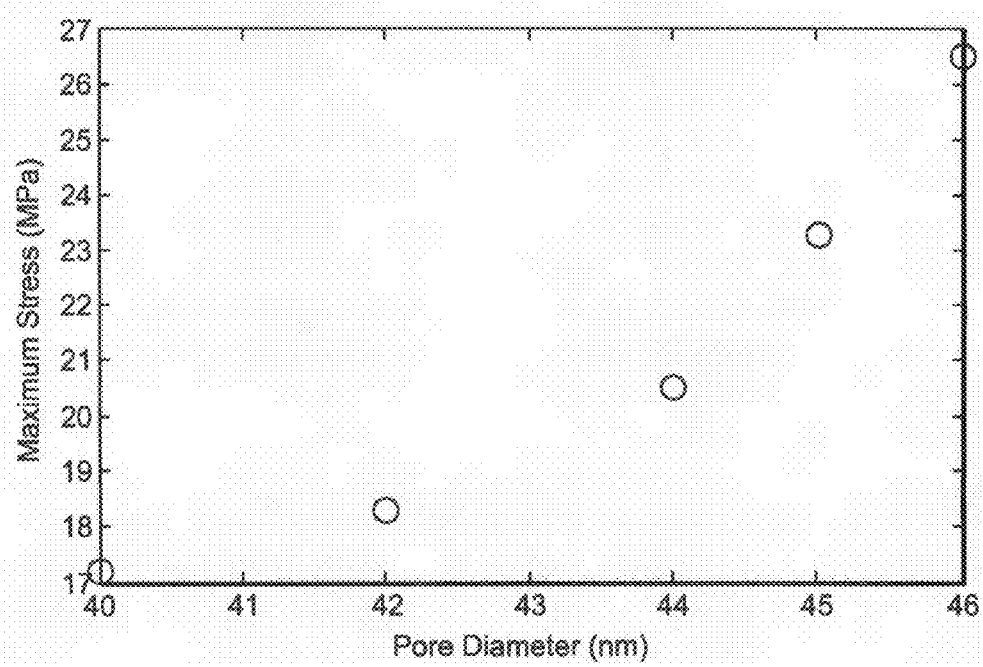
FIG. 11B

EVAPORATIVE HEAT TRANSFER SYSTEM

This non-provisional application claims priority to provisional application Ser. No. 61/752,013 filed on Jan. 14, 2013, the contents of which are incorporated herein by reference in their entirety.

This invention was made with Government support under Grant No. N00014-09-1-1000 awarded by the Office of Naval Research. The Government has certain rights in the invention.

BACKGROUND OF THE INVENTION

This invention relates to heat transfer and more particularly to a heat transfer system using a nanoporous membrane to provide capillary pressure for high heat transport and decoupled from fluidic delivery.

Increasing power densities in high performance systems have led to significant demands for advanced thermal management technologies. Evaporative microfluidic cooling strategies have received significant interest to address the stringent heat flux requirements in high performance systems while significantly reducing size, weight, and power consumption (SWaP). In particular, flow boiling in microchannels has been an active research area [3-5, 24-27] where typical dissipated heat fluxes of $q''=200$ W/cm$^2$ and heat transfer coefficients of $h=10$ W/cm$^2$K using water have been demonstrated for exit qualities below 20% [24]. While heat transfer can be improved when in the annular flow regime with much higher exit quality, challenges exist with flow instabilities [3-5, 25-27]. Despite incorporating surface features and using various water mixtures allowing $q''=600$ W/cm$^2$ and $h=8.8$ W/cm$^2$K, the performance remains fundamentally limited by instabilities [28]. Accordingly, flow restrictors have been proposed [29], but lead to significant increases in pumping power requirements.

Recent developments in thermal ground planes have utilized micro/nanostructured wicks, including sintered copper mesh coated with carbon nanotubes [30], titanium nanopillars [31], and oxidized copper microposts [32], to develop high flux evaporators. A typical value of $q''=550$ W/cm$^2$ and $h=15.4$ W/cm$^2$K over a heated area of 5×5 mm$^2$ was demonstrated with an evaporator area of 2×2 cm$^2$ [30]. However, the performance of such wick is fundamentally limited due to the coupling between the capillary pressure generated by the wick and the liquid transport through the wick. To decrease the transport distance within the wick, liquid supply arteries [33] or bi-porosity [34, 35] have been introduced, and as a result, $q''=380$ W/cm$^2$ with $h=20$ W/cm$^2$K was demonstrated [33]. Even in this configuration, the liquid transport remains in the wick, and limits the maximum heat flux. Meanwhile, to achieve the flow rates required for higher heat fluxes, the height of the wick structure should be >100 μm, which increases the thermal resistance.

A recent study using evaporation through a nanoporous membrane, similar to our concept disclosed herein, demonstrated a maximum $q''\sim600$ W/cm$^2$ with $h=9.4$ W/cm$^2$K [36]. However, the configuration required heat conducting through a liquid layer that limited the thermal resistance, and active pumping, instead of capillarity, to drive the liquid to the membrane, which increased the power consumption.

SUMMARY OF THE INVENTION

The evaporative heat transfer system according to the invention includes a substrate and a plurality of substantially parallel, spaced-apart ridges extending from the substrate forming vertical liquid manifolds therebetween. A nanoporous membrane is supported on the ridges and a pump delivers a dielectric fluid across the edges. The fluid is drawn through the liquid manifolds via capillarity provided by the nanoporous membrane and evaporates to dissipate heat flux through the substrate. A preferred dielectric fluid is pentane. The pore size in the nanoporous membrane is selected to provide high capillary pressures. In one embodiment, the pore size is approximately 40 nm and capillary pressure is approximately 1.1 MPa.

In a preferred embodiment, membrane porosity varies across the membrane to tailor thermal resistances to limit temperature rises. In a preferred embodiment, the system is configured to dissipate greater than 1 kW/cm$^2$ on a 1 cm$^2$ area having a 200 by 200 μm hotspot dissipating greater than 5 kW/cm$^2$. It is preferred that a condenser be provided to capture vapor to recirculate liquid to the pump. A suitable substrate is SiC.

BRIEF DESCRIPTION OF THE DRAWING

FIG. 9a illustrates the geometry and prescribed boundary for thermal simulations.

FIG. 9b is a graph of maximum temperature at a hotspot as a function of accommodation coefficient based on simulation results.

FIG. 10 is a graph of simulated temperature distribution from the center to the edge of a chip with a hot spot and background fluxes.

FIG. 11a is an illustration showing geometry and prescribed boundary conditions for stress simulations.

FIG. 11b is a graph for a sensitivity analyses of the maximum stress on pore diameter.

DESCRIPTION OF THE PREFERRED EMBODIMENT

Figure 1:
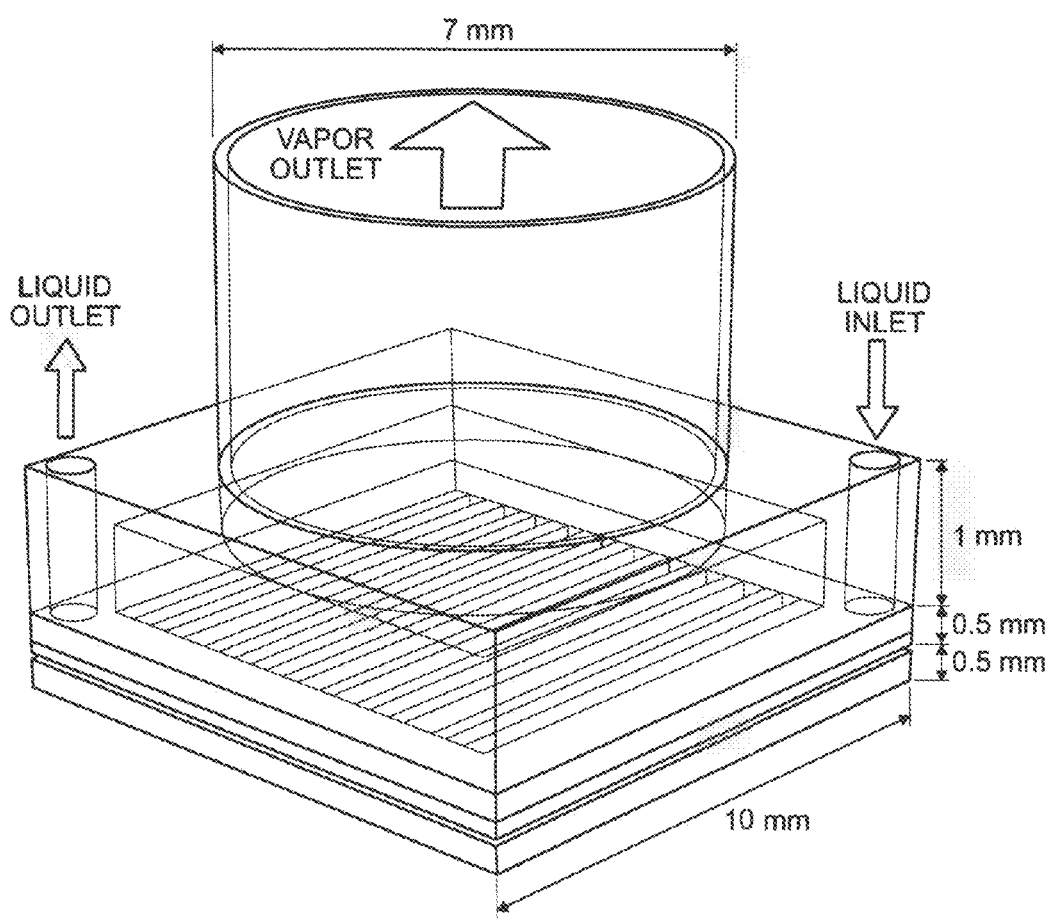
FIG. 1 is a perspective view of an embodiment of a high flux membrane-enhanced evaporative microfluidic device for dissipation of high heat fluxes according to the invention.
Figure 2A:
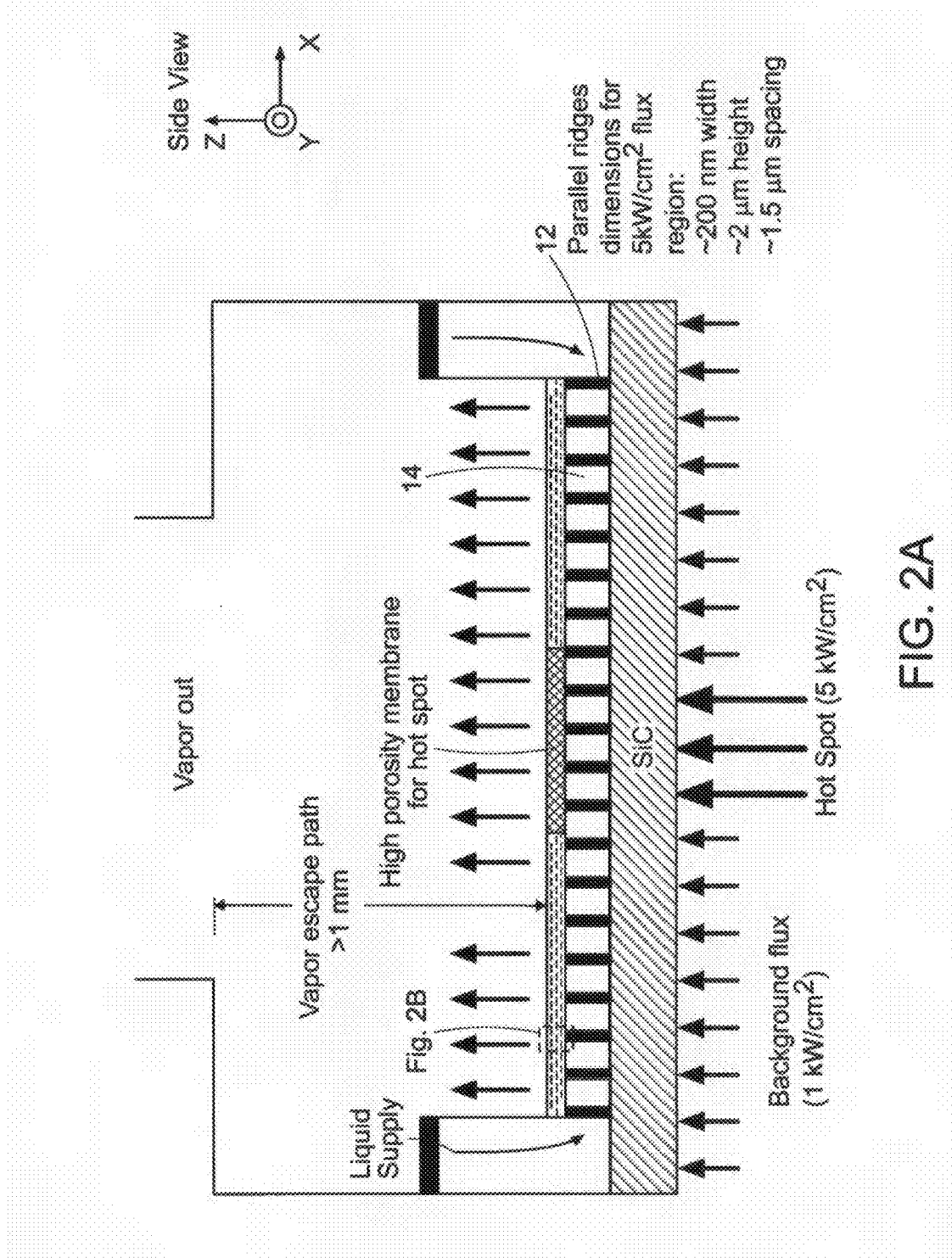
FIG. 2 is a detailed schematic diagram of an embodiment of the evaporative microfluidic thermal management system according to the present invention.
Figure 2B:
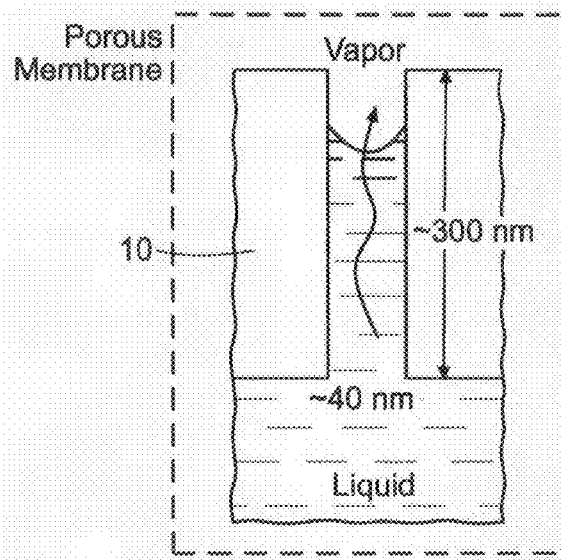
Figure 2C:
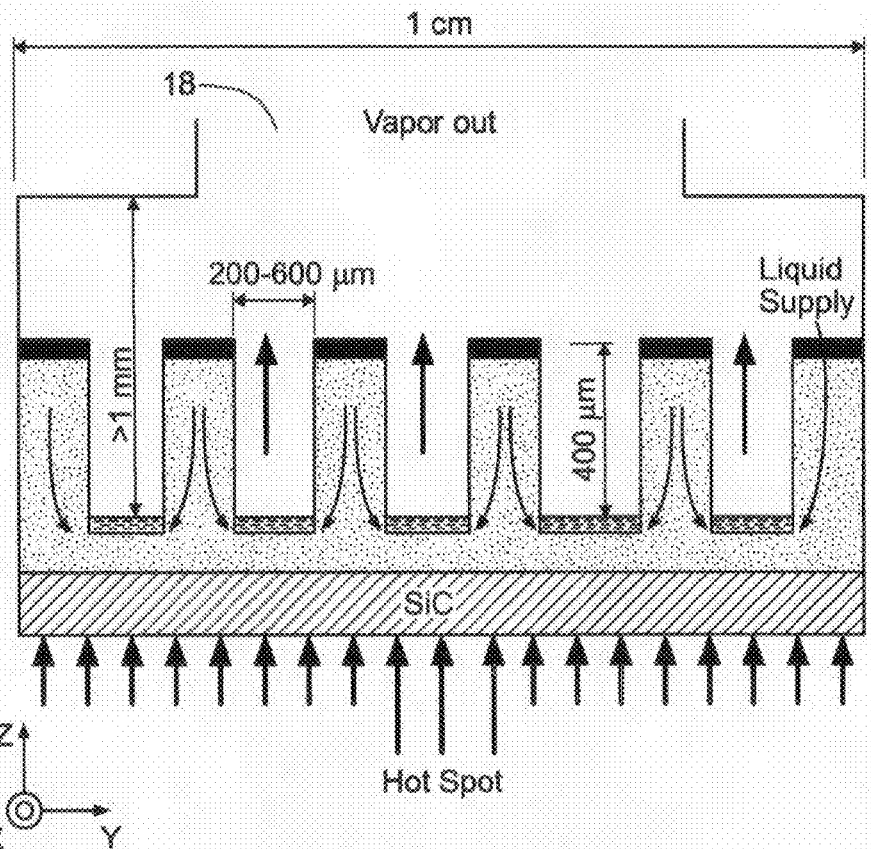
Figure 2D:
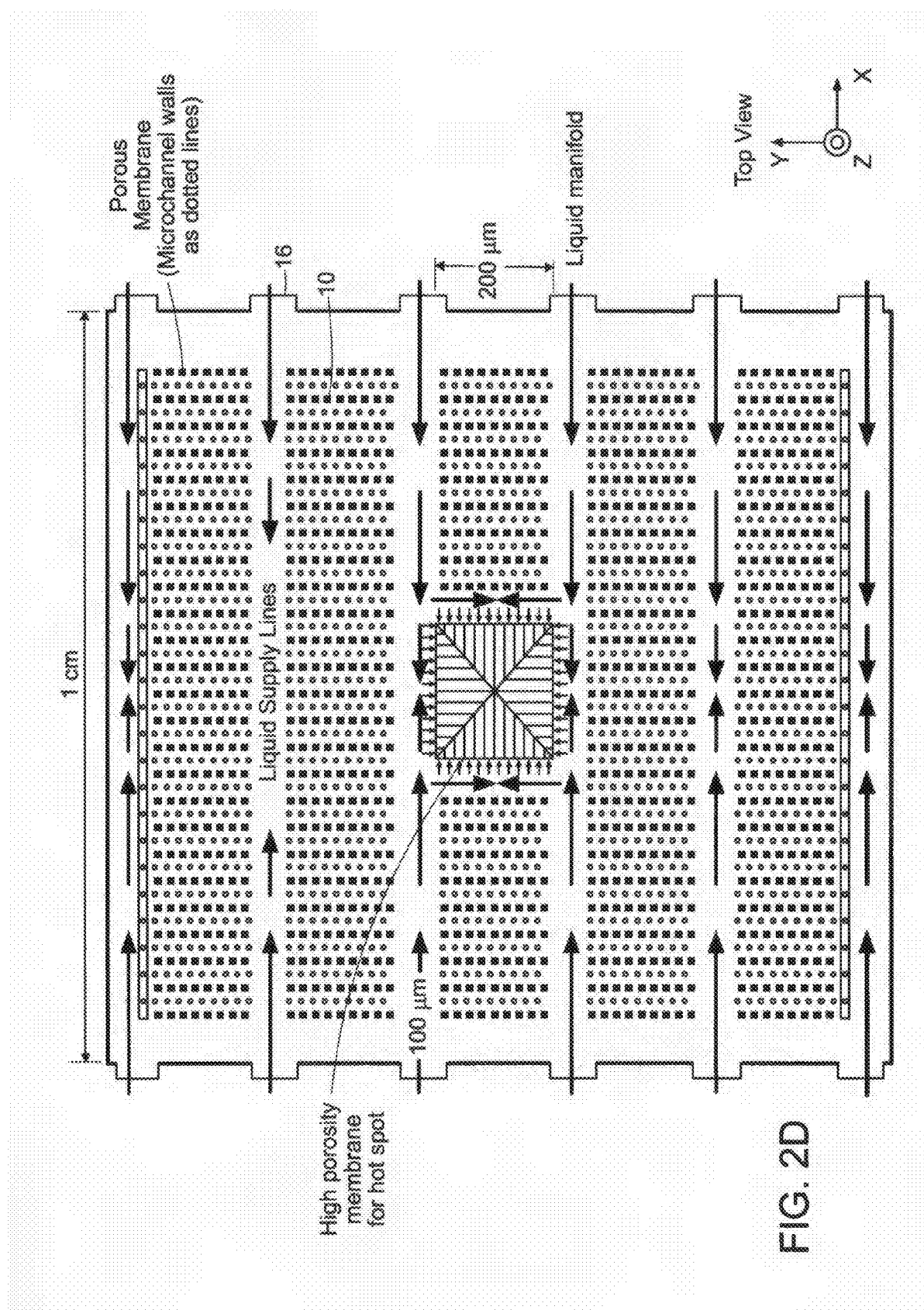

We disclose a unique intrachip two-phase evaporative cooling solution capable of dissipating >1 kW/cm² for a 1 cm² chip area with a local 200×200 μm² hot spot >5 kW/cm² (FIG. 1). A mechanical pump delivers a dielectric fluid, such as pentane, across microchannels whereby liquid is drawn in through the vertical liquid manifolds towards the heated surface via capillarity using a thin nanoporous membrane. The membrane provides an important functionality to the approach and allows the delivery of the necessary flow rates to dissipate the requisite heat fluxes. Subsequently, the vapor generated by evaporation exits through the backside and is guided to an external condenser where the liquid is recirculated back to the pump. A detailed design of the proposed concept is shown in FIG. 2, which has several important innovations.

A nanoporous membrane 10 is supported by parallel ridges 12 forming vertical channels 14 therebetween. Liquid is supplied through liquid supply lines 16. Vapor exits through an outlet 18. Liquid is drawn to the membrane via capillarity through the microfluidic network, which includes the ridges 12 that serve as mechanical supports for the membrane 10 and reduces the thermal resistance between the surface and evaporating region. Hot spot and background heat flux are both mitigated using different membrane, pore and ridge geometries. The desired dimensions for an embodiment of the invention for a nanoscale pore for a desired capillary pressure is shown in the inset.

The device architecture disclosed herein leverages nanoporous membranes to decouple the heat dissipation from the pressure drop of the device. With nanopores of diameter ~40 nm, high capillary pressures (~1.1 MPa) can be generated to achieve high mass flow rates (~2.9-5.8 g/s) necessary for evaporation with low liquid inlet to outlet pressure drops (<8 kPa=0.05 $P_{sat}$). By relying on capillarity as the main pumping mechanism, the thermofluid CoP is >100.

Both the hotspot and background fluxes can be dissipated using the same ridge-supported membrane concept by varying key geometries within the wick, e.g., membrane porosity, to tailor thermal resistances to limit the temperature rise of the hotspot $\Delta T_{hs}$<5 K over the background. This approach of using the same mechanism offers increased reliability, reduces complexities in fabrication to create a monolithic device, and offers the flexibility to be integrated with advanced solid-state solutions in the future.

The fluidic delivery to the evaporative region from the inlet microchannels is self-regulated by the capillarity of the membrane and eliminates the need for additional fluidic valves and active control on chip.

Parallel ridges in SiC provide both mechanical support for the nanoporous membranes and enhanced thermal conductivity to minimize the thermal resistance between the chip substrate and evaporation region to ensure that the temperature rise above the inlet is $\Delta T$<30 K. The combined heat transfer coefficient of the membrane and supported ridge for the hotspot can therefore be as high as h=0.18 kW/cm²K, an order of magnitude higher than any state-of-the-art two-phase cooling solution. The overall can be easily scaled to larger areas to tackle thermal management needs of multiple devices on the same substrate.

The disclosed intrachip evaporative cooling approach will target applications in GaN electronics with silicon carbide (SiC) substrates and typical device dimensions of ~1 cm² area and >100 μm thickness. The strategy seeks to maintain the backside chip temperature at ~75-80° C. The membrane and the supporting ridge structures will be fabricated in SiC which has a large bulk thermal conductivity of ~450 W/mK.

Figure 4:
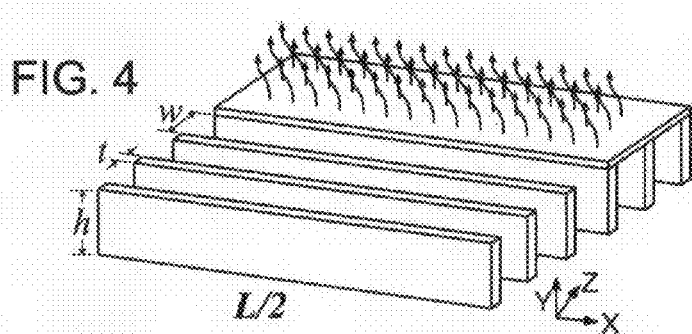
FIG. 4 is a schematic illustration of a thin-film wick for an embodiment of the invention showing a portion of the nanoporous membrane removed to reveal supporting ridges.
Figure 5:
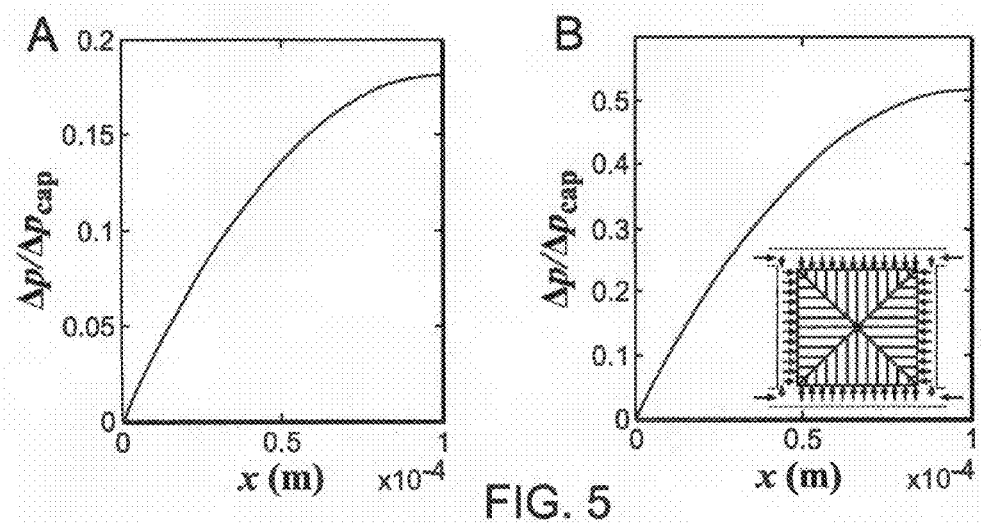
FIG. 5a is a graph of ridge channel pressure drop for a background flux area.
FIG. 5b is a graph of ridge channel pressure drop for hotspot ridges according to an embodiment of the invention.

In the hot spot region (q"=5 kW/cm²), the target characteristic pore diameter of 40 nm will generate capillary pressures of $\Delta P_{cap}$~1.1 MPa (FIG. 3a) with pentane as the working fluid. The thickness of the membrane will be ~300 nm, which is determined by the requirement to maintain the meniscus at the mouth of the pore to maximum the vapor transmission probability [14]. With a 300 nm membrane thickness (FIG. 3b), 50% of the capillary pressure budget is available to drive flow within the device without hindering the evaporative heat transfer behavior of the membrane. Meanwhile, parallel ridges will support the membrane (FIG. 4) and also provide the liquid path to the membrane. The ridges have dimensions of thickness t=200 nm, height h=2 μm, and spacing w=1.5 μm. The pressure drops across each ridge with distance x for the background and hot spot flux areas are shown in FIGS. 5a and b, respectively. The results indicate that the capillary pressure from the membrane can not only drive the flow from the ridges, but also in the low-pressure-drop liquid manifolds (not shown) to dissipate the large fluxes.

While the liquid in the wick can reach negative absolute pressures (~-0.4 MPa at L/2), nucleation/cavitation is not expected until T=422 K or $P_{cav}$~-13 MPa at T=343 K based on the kinetic limit of homogenous nucleation for pentane [15, 16]. The chosen ridge geometry ensures that the maximum temperature drop across the thin-film region from the substrate to the saturated vapor is $\Delta T$<30 K, where the conduction resistance of the ridges and fluid, as well as the liquid-vapor interfacial resistance were considered in the estimates. To address both the background and hot spot heat flux with the membrane approach, the thermal resistance of the entire wick (membrane and ridges) over the background flux area will be increased to limit the temperature difference between the hot spot and the background flux to <5 K. We conservatively estimate that for a membrane porosity $\phi_p$=0.5 and a dissipated heat flux of q"=5 kW/cm², the temperature rise will be $\Delta T$=27.9 K (with an interfacial heat transfer coefficient, $h_{interface}$=0.69 kW/cm²K [17]) (FIG. 6a) with maximum pressure difference across the membrane is $\Delta P$=0.545 MPa. This result includes the ballistic phonon transport in nanoscale geometries, i.e., the thermal conductivity of the ridges and membrane are estimated as 350 W/mK and 35 W/mK, respectively [18]. In addition, we assessed the mechanical integrity of the membrane subject to stress generated by the capoillary pressure (FIG. 6b) and show that the maximum stress was ~17 MPa, which is well below the fracture strength of SiC, $\sigma_f$=500-1500 MPa [19].

With this design, liquid will enter the device at $T_{inlet}$=323 K with an inlet quality of 0 and vapor will exit at $T_{sat}$=323 K with an exit quality of 1. The self-regulating microfluidic manifolds with the membrane design alleviates the overall pumping requirements (FIG. 1, liquid inlet-outlet) with $\Delta P$~5 kPa and the flow rate Q~300-600 mL/min. Therefore, the CoP=Q/$W_p$, where Q is the total thermal power dissipated from the device and $W_p$ is the power input, can be >100 with an off-the shelf pump (MZR®-11508, Micropump). These estimates suggest that the proposed evaporative membrane based approach is viable to dissipate the requisite power densities.

Pentane is chosen as the dielectric working fluid owing to the favorable thermophysical properties compared to other dielectrics including high latent heat (350 kJ/kg), thermal conductivity (0.11 W/mK), and low specific volume of vapor (0.22 m$^3$/kg). Pentane has been investigated for potential electronic cooling applications [20, 21] due to its non-polar and non-toxic nature, and good dielectric constant and strength of 1.84 and ~1.4 kV/mm [22], respectively. Other suitable dielectric fluids will be apparent to those of skill in this art.

Figure 7:
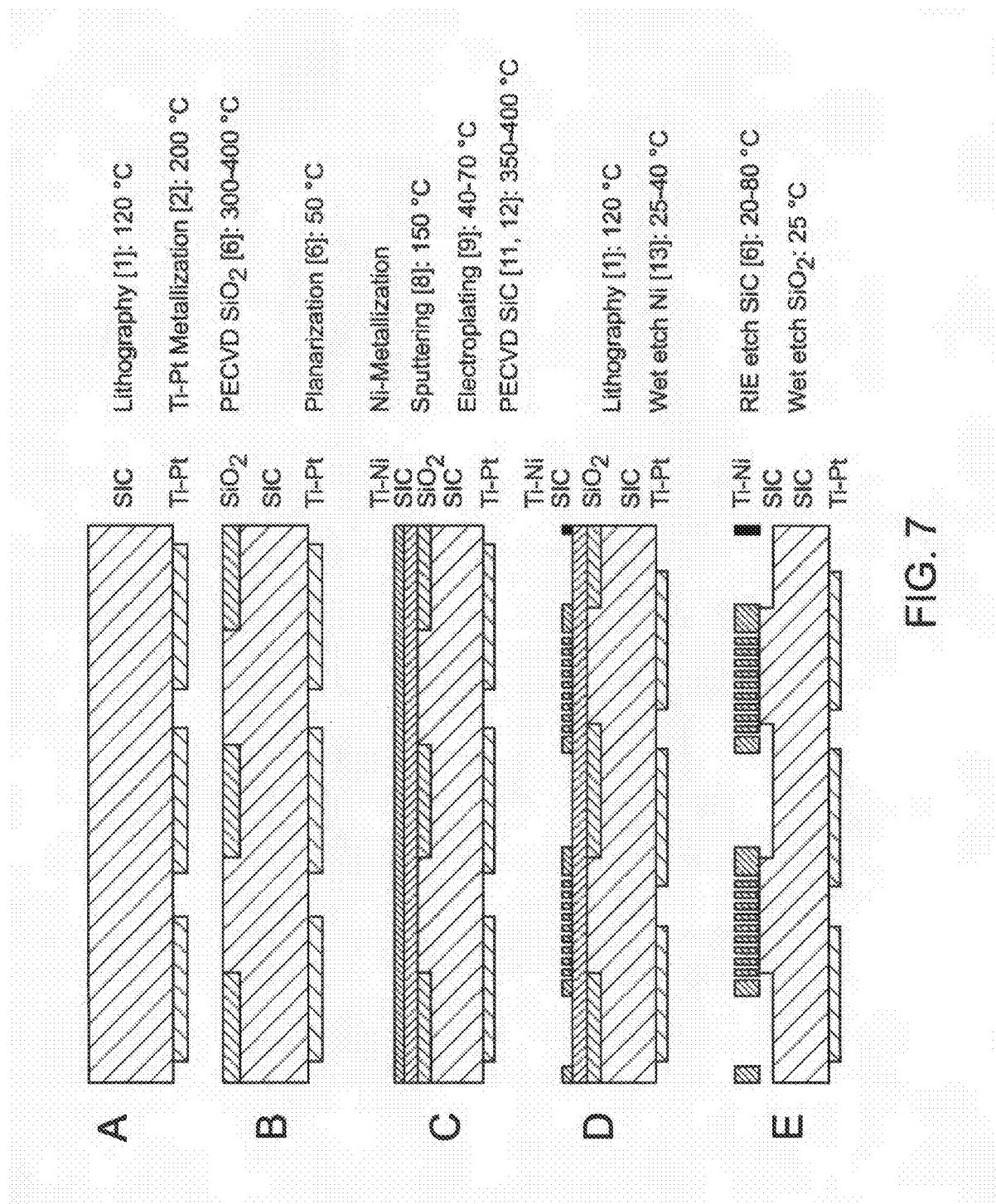
FIGS. 7a, b, c, d and e are process flow diagrams for fabrication of the heat transfer system disclosed herein.

The membrane and ridges are fabricated in Si first, and then later in SiC, while the microfluidic network for liquid and vapor flow will be fabricated in Si using standard lithography and DRIE. We plan first to develop test devices in Si to minimize cost and validate the design and fabrication strategies. The fabrication steps for a SiC based device is shown in FIG. 7 and described in detail below. The SiC substrate is attached to the Si microfluidic manifolding layer using eutectic bonding [23]. The slight thermal expansion mismatch between Si ($\alpha \approx 3e-6/°$ C.) and SiC ($\alpha \approx 2.8e-6/°$ C.) will generate minimal stresses due to the small temperature differences (<30 K). The overall thickness of the cooling device is <2 mm, such that the heat density removed is >1 kW/cm$^3$. Hermetically scaled connectors are added by evaporating Ti/Ni/Au as the metallization layer for soldering. A Cu insert with tubing attached is then soldered into each fluidic opening, which is a fluxless process, eliminating contamination issues.

Figure 8:
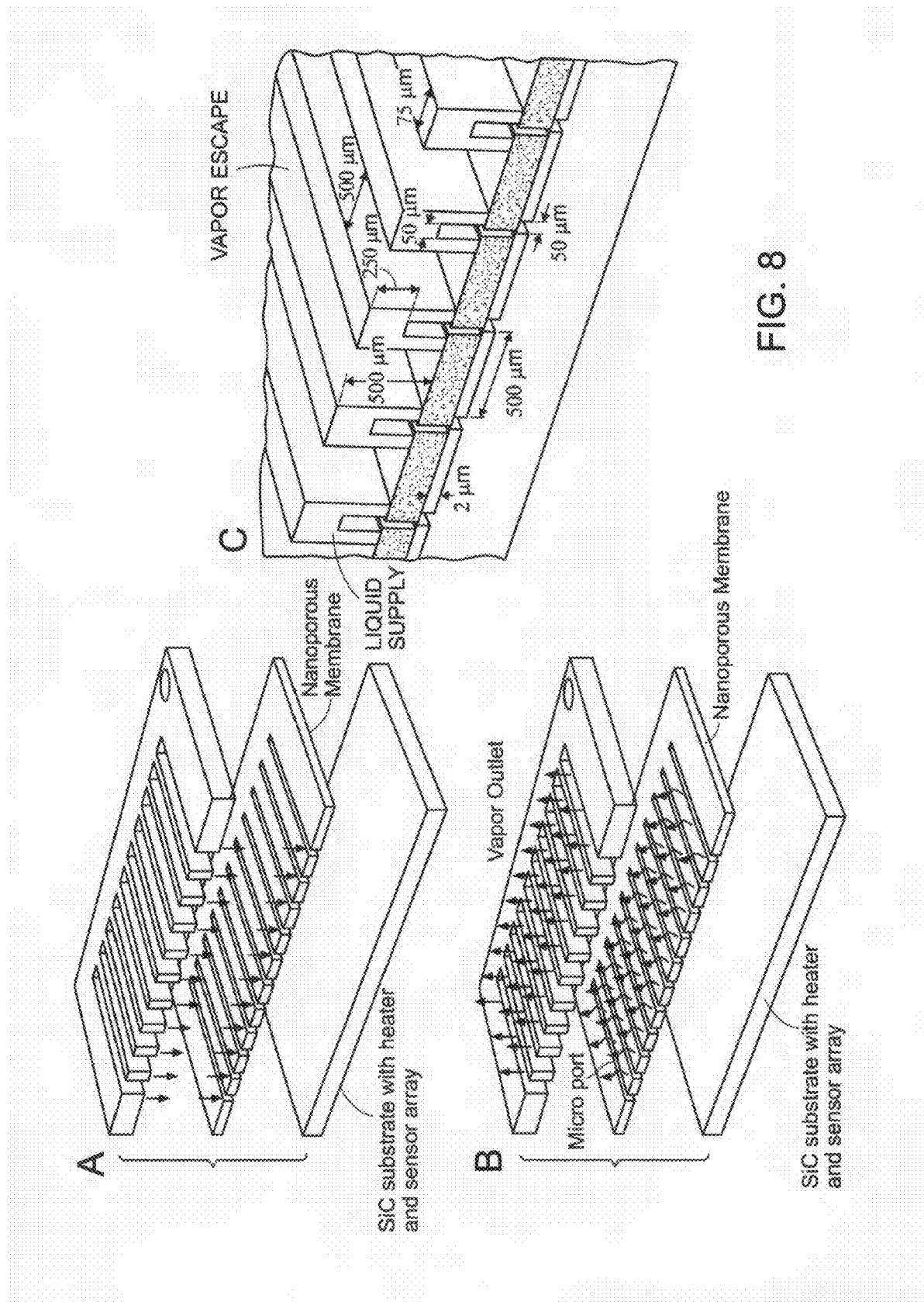
FIG. 8a is an exploded view showing an embodiment of the evaporative microfluidic device disclosed herein interfaced to a hot chip. Pumped liquid supply in microchannels drawn through vertical liquid manifold by capillarity.
FIG. 8b is an exploded view of an embodiment of the invention, showing vapor exiting from the evaporating membrane through outlet ports.
FIG. 8c is a magnified, perspective view of the device disclosed herein cross section.

The intrachip two-phase evaporative cooling solution disclosed herein is capable of dissipating >1 kW, >1 kW/cm$^2$ for a 1 cm$^2$ chip area with a local 200×200 μm$^2$ hot spot >5 kW/cm$^2$ (FIG. 8, also see FIGS. 1&2). An important element that enables the requisite high performance is the utilization of the nanoporous membrane. The nanometer pores (diameter ~40 nm) provide the requisite capillary pressure to deliver the liquid to the high flux surface. Through the evaporation process, the latent heat of vaporization of pentane effectively dissipates the generated heat from the surface. Meanwhile, this high capillary pressure is decoupled from liquid transport, which allows for low viscous losses. This is a critical aspect to achieve the desired metrics. The dielectric fluid, pentane, is pumped across microchannels (top layer, FIG. 8a), whereby liquid is drawn in through the vertical liquid manifolds (arrows) towards the heated surface via capillarity using a thin nanoporous membrane. The capillarity of the membrane also self-regulates the fluid delivery to the evaporative region, which eliminates the need for active fluidic control on chip. The vapor generated by evaporation within the membrane exits (FIG. 8b) to an external condenser where the liquid is recirculated back to the device. A magnified view is also shown (FIG. 8c) with detailed dimensions. The overall thickness of the cooling device will be <2 mm, such that the heat density removed is >1 kW/cm$^3$.

Compared to previous high flux heat transfer approaches, our disclosed membrane solution offers the following advantages: 1. The liquid transport is completely decoupled from the capillary pressure generation. The capillary pressure is generated by the nanopores in the membrane while the liquid transport is through the supporting ridges, allowing the flexibility to scale down the nanopore size to achieve large driving pressures without significantly increasing the viscous losses. 2. The vapor escape above the membrane is separate from the liquid flow path such that flow instabilities are avoided with 100% vapor exit quality. 3. The heat is dissipated primarily via evaporation, which improves the heat transfer coefficient and the stability. 4. The primary heat conduction path is through the SiC supporting ridges and membrane structure, which decreases the overall thermal resistance.

Our preliminary modeling efforts suggest that all of the metrics can be achieved with our proposed approach. Here, we describe the wick (membrane and ridges, FIG. 4.) and fluidic supply geometry capable of dissipating the 5 kW/cm$^2$ "hotspot" over a characteristic area of 200×200 μm$^2$ with the temperature, power, and other requirements. We demonstrate the viability of the approach using the more severe heat flux case, and suggest that the requirements for the background case can also be achieved with the same approach with proper optimizations.

The membrane pores provide the capillary pressure to dissipate the requisite heat flux. The maximum capillary pressure associated with a pore radius, $r_p$, (FIG. 3a) is given by the Young-Laplace equation, $$\Delta p_{cap} = \frac{2\gamma_{lv} \cos\theta}{r_p}, \qquad \text{Eq. 1}$$

where θ is the wetting angle. For a pore radius of 20 nm, the membrane is capable of generating capillary pressures of $\Delta P_{cap}$~1.1 MPa with pentane as the working fluid (θ~020 for well-wetting pentane). The membrane porosity was specified as $\phi_{p,m} = \pi r_p^2/l_p^2 \approx 0.5$ with a pore pitch of $l_p=$ 50 nm, indicating a pore-level average heat flux of $q_i'' = q''/(\phi_{p,m}\phi_{p,r}) = 11.3$ kW/cm$^2$.

Figure 3:
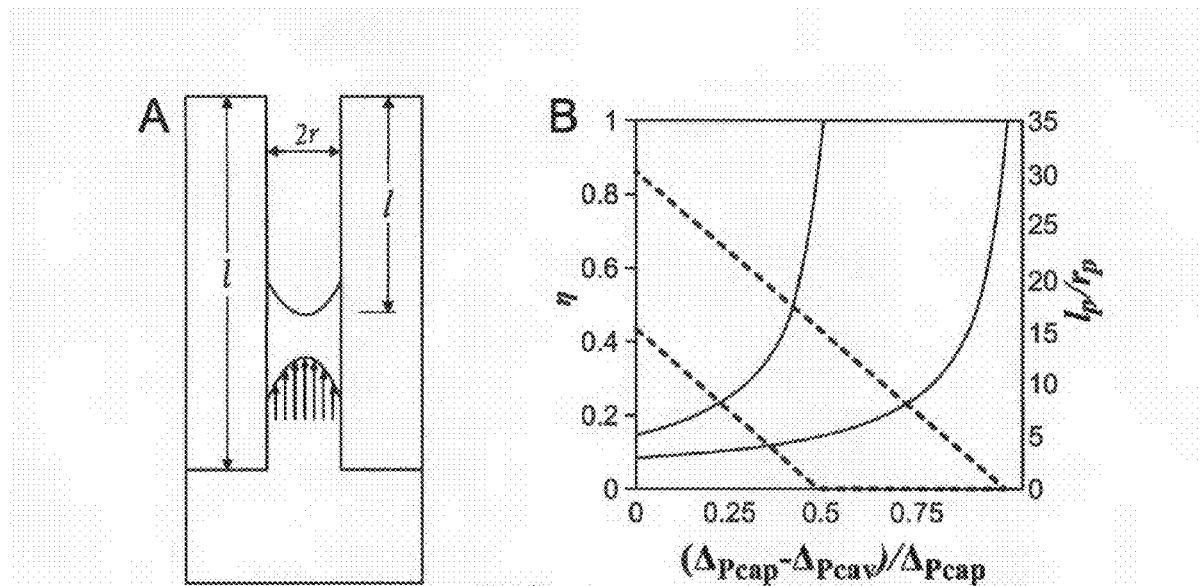
FIG. 3a is a schematic diagram showing a single pore in a nanoporous membrane used in the invention.
FIG. 3b is a graph of transmission probability as a function of available pressure budget.

The thickness of the membrane is determined by the requirement to maintain the meniscus at the mouth of the pore to maximize the vapor transmission probability [14] given by $$\eta = 1 + \frac{\hat{l}^2}{4} - \frac{\hat{l}}{4}\sqrt{\hat{l}^2 + 4} - \frac{\left[(8 - \hat{l}^2)\sqrt{\hat{l}^2 + 4} + \hat{l}^2 - 16\right]^2}{72\hat{l}\sqrt{\hat{l}^2 + 4} - 288\ln\left[\hat{l} + \sqrt{\hat{l}^2 + 4}\right] + 288\ln 2}. \qquad \text{Eq. 2}$$

where $\hat{l}=l_p/r_p$. Once the meniscus begins to recede into the pore, the effective heat transfer coefficient, $h_p=\eta h_i$ becomes the product of the transmission probability, η and the interfacial heat transfer coefficient, $h_i$. We model pressure drop in an individual pore as a laminar tube flow (fRe$_p$=64) since Re$_p=q_i 2r_p/(h_{fg}\mu)$~0.1. Thus, the maximum length of the pore (membrane thickness) associated with dissipating a pore level heat flux While maintaining the pore completely full with liquid is given by $$l_{p,max} = \frac{1}{f}(\Delta p_{cap} - p_{in})4r_p p_l\left(\frac{h_{fg}}{q_i''}\right)^2, \qquad \text{Eq. 3}$$

where $p_{in}$ is the pressure at the inlet to the pore from the ridges. As shown in FIG. 3b, for a membrane thickness of $l_{mem}$=300 nm, ~50% of the capillary pressure budget is available to drive the flow in the ridges without hindering membrane heat transfer. Doubling the thickness of the membrane to 600 nm reduces the available budget to ~1%. This analysis indicates that further thinning of the membrane can have significant fluidic advantages by providing more capillary budget without hindering phase-change mass (heat) transfer in the pore. However, further reducing the thickness or the membrane must be balanced against the need to maintain a suitable conduction path to the pores from the ridges and the mechanical integrity of the membrane (see below).

Meanwhile, parallel ridges (FIG. 4) support and provide a liquid path to the membrane where the geometry is given by height, h, thickness, t, gap spacing, w, and corresponding porosity defined as $\phi_{p,r}=1-[t/(w+t)]$. The maximum height of the ridges is constrained by a maximum feature aspect ratio dictated by etching limitations for SiC, $h_{max}=10t$ [37]. Thus, for $t=200$ nm, $h_{max}=2$ μm, a maximum $w=1.5$ μm was set to minimize conduction resistances and mechanical integrity issues. To ensure that the pumping capillary pressure is sufficient, the pressure drop between the parallel ridges was determined using the expression for laminar flows (Re~50), $$\frac{dp_l}{dx}(x) = -\frac{fRe\rho_l v_l(x)^2}{2D_h Re(x)}, \quad \text{Eq. 4}$$

where fRe, the Pouiseille number, is taken from [38], $v_l(\chi)$ is the $\chi$-dependent mean velocity calculated from an energy balance from evaporation through the membrane, $Re(\chi)=\rho_l v_l(\chi)D_h/\mu_l$ is the $\chi$-dependent Reynolds number, and $D_h=2wh/(w+h)$ is the hydraulic diameter and $\rho_l$ is the liquid density. FIG. 5a shows that the maximum pressure drop for the required mass flow rates to dissipate 1 kW/cm² is significantly smaller than the maximum capillary pressure (~$0.2\Delta p_{cap}$) where the flow length is L=W/2 (~$0.5\Delta p_{cap}$ for q"=2.75 kW/cm²). Similarly, FIG. 5b shows that for the hotspot, the maximum pressure drop for the required mass flow rates is approximately half the maximum capillary pressure (~$0.5\Delta p_{cap}$) where the average flow length is L=W/4. While the liquid in the wick can reach negative pressures (~−0.4 MPa at the center of the patch), nucleation/cavitation is not expected until T=422 K or $P_{cav}$~−13 MPa at T=343 K based on the kinetic limit of homogenous nucleation for pentane [15, 16], provided that we avoid introducing nucleation sites that lower the activation energy during fabrication.

We similarly determined the pressure drop in the microfluidic manifold to supply liquid to the wick for a geometry with liquid flow length of $L_{ls}=5$ mm, width $W_{ls}=50$ μm, height $H_{ls}=250$ μm ($Re_{ls}$~1500). The pressure drop was ~$1\times10^{-2}$ $\Delta P_{cap}$, indicating that the capillary pressure from the membrane also drives the flow in the supply lines connected to the low-pressure-drop liquid manifold.

These results suggest that a key advantage and novelty of the proposed approach is that by using capillarity with a nanoporous membrane, we can achieve a self-regulating system that alleviates the need for external valves, and decreases the overall pumping requirements of the system. While such capillarity-driven systems have been successfully demonstrated in numerous previous studies [30-36], including our own [39], an important aspect of this invention is demonstrating the ability achieve the high capillary pressures in the fabricated nanoporous membranes seamlessly integrated with the supported ridge structures and liquid supply lines.

In addition to the requirement to dissipate the high heat fluxes, the overall thermal resistance of the wick needs to be considered because it determines the temperature of the device. The temperature drop from the substrate to the vapor during heat transfer is dictated by the following two resistances. Note that due to the large q" and small size of the wick, the two resistances are of the same order and need to be considered carefully. For our preliminary calculations, we used classical kinetic theory [17, 46] to capture the liquid vapor interface resistance. The local heat flux at the interface of the pore, $q_i''=q''/(\phi_{p,m}\phi_{p,r})$, can be determined for the non-negligible velocity of vapor away from the interface during evaporation [17, 46], For the specified $T_v=323$ K and $q_i''=11.3$ kW/cm² ($q_i''=5$ kW/cm²) and assuming that an accommodation coefficient, $\hat{\sigma}=0.9$, the temperature drop across the liquid-vapor interface is $\Delta T_i=15.05$ K, indicating a characteristic interfacial heat transfer coefficient of $h_i=q_i''/\Delta T_i$~0.69 kW/cm²K.

Note that there are several competing theories to predict the behavior of the liquid/vapor interface during phase change in addition to kinetic theory, such as statistical rate theory [47]. We seek to perform careful temperature measurements close to me interface based on our established experimental technique [48] to identify the appropriate theory for the modeling efforts. Accordingly, we can incorporate the liquid-vapor interface resistance as described above as a boundary condition to determine the overall resistance and associated temperature rise from the substrate to vapor. Given the complex conduction paths in the wick, we used 3D finite element simulations with COMSOL with material properties from Table 1 to model the heat transfer associated with the conduction resistance of the ridges and fluid. FIG. 9a shows the simulated geometry with the pore and ridge dimensions (described above) with the prescribed boundary conditions, and thermal conductivities accounting for ballistic phonon transport in nanoscale geometries, i.e., the thermal conductivity of the ridges and membrane are 350 W/mK and 35 W/mK, respectively [18].

TABLE 1

Thermal and mechanical properties of the chip material

| Material | Thermal conductivity, k (W/mK) | | Elastic modulus, λ (GPa) | CTE, α (10⁻⁶ K) | Poisson ratio, ν | Fracture strength (MPa) |
| --- | --- | --- | --- | --- | --- | --- |
| | Bulk | Nanorestricted, characteristic length 20 nm | | | | |
| Silicon (Si) | 149 [40] | 10 [41] | 130 in <100>; 169 in <110> [42] | 3 [40] | 0.28 <100>; 0.064 <110> [42] | 300-600 [43] |
| Silicon carbide (SiC) | 450 [41] | 35 [41] | 400 [44] | 2.77 [40] | 0.19 [44] | 500 [45] |

Figure 6:
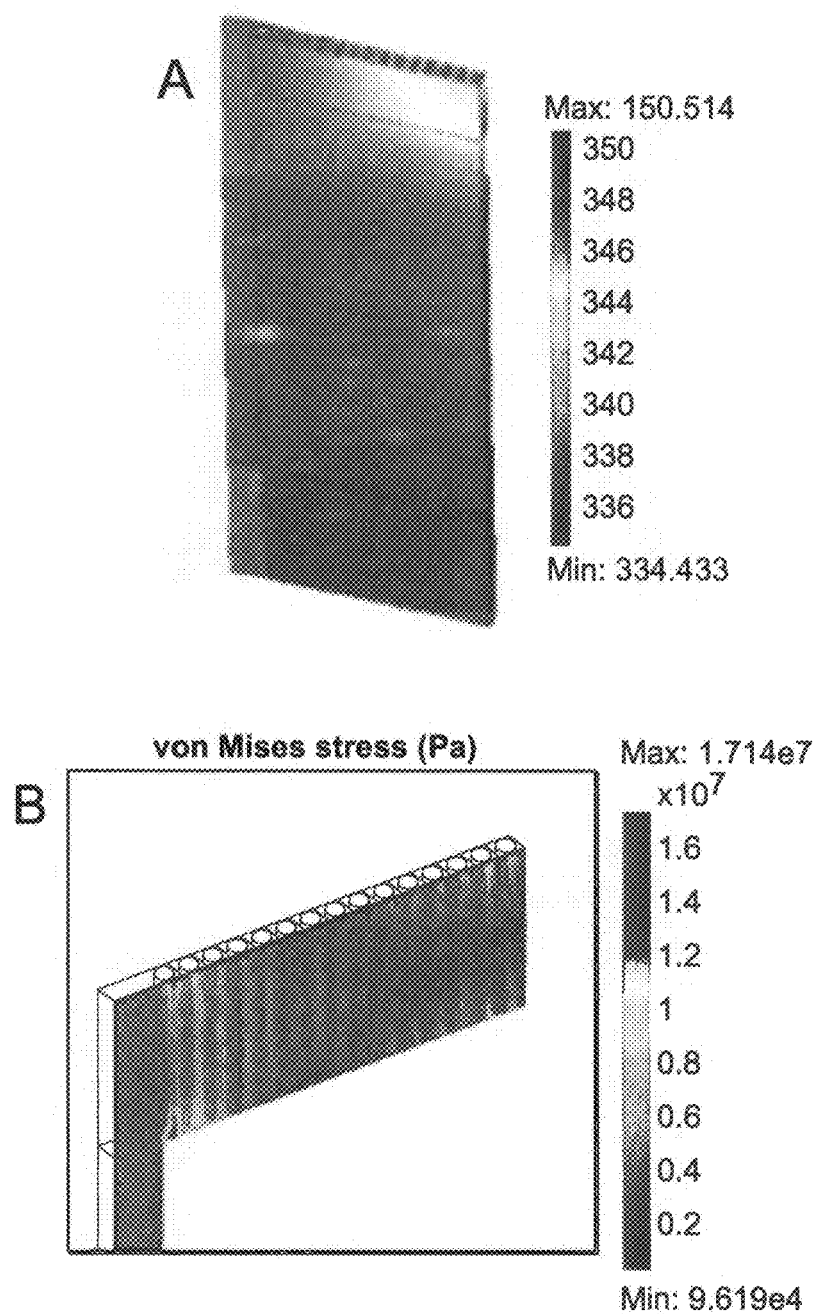
FIG. 6a illustrates temperature distribution in COMSOL simulations of membrane geometry.
FIG. 6b is a graph showing stress distribution in a plane under a pressure load.

The results of the simulation, FIG. 6a, shows that the target imposed heat flux of q"=5 kW/cm² results in a total temperature rise of 27.9 K corresponding to a substrate temperature of $T_s$=351 K and an overall heat transfer coefficient of h=0.18 kW/cm²K. Note that this overall heat transfer coefficient is an order of magnitude higher than those reported in previous works. To address both the background and hot spot heat flux with this approach, the thermal resistance of the entire wick over the background flux area will be increased by adjusting the wick geometry (e.g., porosity) to limit the temperature difference between the hot spot and the background flux to <5 K. FIG. 10 shows simulation results for the temperature distribution along the length of the device with the hotspot and background fluxes applied and effective heat transfer coefficients of 180 W/cm²K and 40 W/cm²K, respectively. The maximum temperature variation across the chip is <4 K, which meets the $\Delta T_{across-heat-chip}$<10 K requirement.

While these simulations suggest a viable approach, an important aspect that needs to be considered to achieve the high interfacial heat transfer coefficients is the accommodation coefficient, $\hat{\sigma}$. Using our model, we investigated the maximum temperature at the hotspot as a function of the accommodation coefficient at the evaporating interface (FIG. 9b). and show that $\hat{\sigma}$>0.57 is needed to achieve the design goal. A significant body of previous work focused on measuring the accommodation coefficient for various liquids and report a large range from 0.001-1 depending on the purity of the interface [17, 49-52]. Previous results on non-polar fluids, such as benzene and carbon tetrachloride, show an accommodation coefficient closer to 1 can be obtained [50, 51]. As such, we anticipate that pentane can achieve similar results. Part of our detailed characterizations will be focused on achieving the requisite $\hat{\sigma}$ values by attaining clean interfaces.

Due to the thin geometry of the membrane, we also assessed the mechanical integrity of the membrane subject to stress generated by the capillary pressure (FIG. 11, FIG. 6b) with material properties in Table 1. FIG. 11a shows the geometry and prescribed boundary conditions for the simulations with a pressure load of 0.545 MPa which is 50% of the capillary pressure and the pressure drop across the membrane to maintain the meniscus at the top opening of the pores (Eqn 3). FIG. 6b shows that the maximum stress was ~17 MPa, which is well below the fracture strength of SiC, $\sigma_1$=500-1500 MPa [19]. We also note that if there is variability in the pore size, that there is little sensitivity to the maximum stress, therefore, mechanical failure should not be a critical failure mechanism.

These preliminary models suggest that the proposed evaporative membrane based approach is viable to dissipate the requisite power densities with the associated metrics. Also, given the expected variations of <15% in pore radius and <5% in membrane thickness which are the dominant fabrication factors affecting device performance, there is sufficient margin to meet the requirements.

Figure 12:
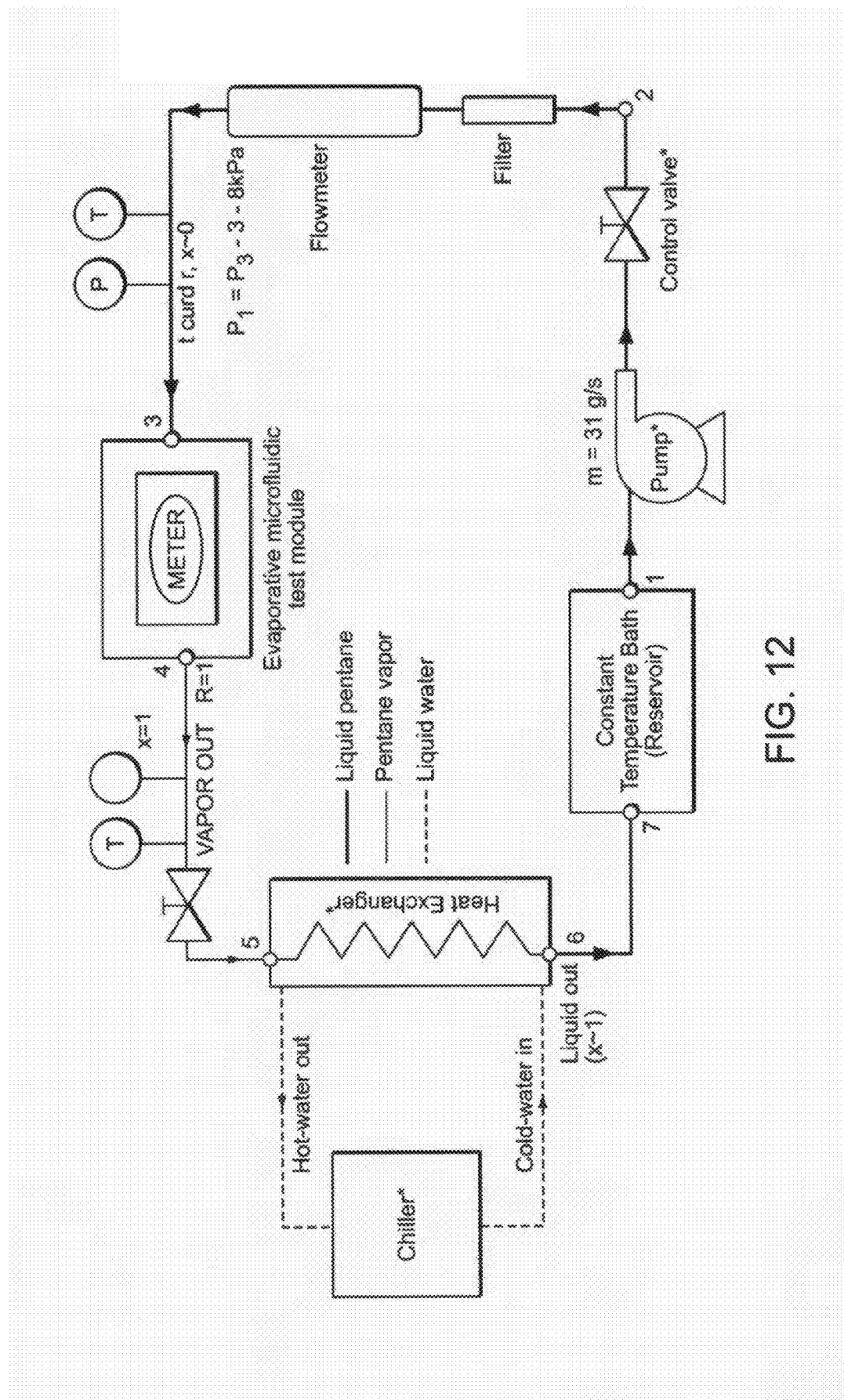
FIG. 12 is a schematic illustration of a flow loop for the device according to the invention.

A schematic of the flow loop is shown in FIG. 12. The constant temperature bath which also serves as a liquid reservoir maintains the dielectric fluid at near saturated conditions (x~0). A pump (mzr-11508, Micropump) circulates pentane through a filter, a flow-meter, and temperature and pressure sensor to the test module (3). Since the proposed concept relies on the high capillary pressure generated by the membrane for efficient fluid delivery, the pump is only required to supply the fluid from the external reservoir (1) to the inlet manifold (3) through a series of ¼" diameter copper tubings. The required liquid flow rate of 300 mL/min (5.1 cm³/s) implies a minimal pressure difference of 5-8 kPa (with 3 m long 0.25" tubing, two 90° turns and a flow meter) to maintain the liquid flow ($\Delta p$~0.05 $p_{sat}$). Vapor (100% quality) that exits the heated test module (4) is then condensed (5-6) using a custom heat exchanger and chiller (NeslabHX-75, Thermo Electron Corporation). The small pressure drop of ~3 kPa to drive the Vapor from the exit manifolds to the condenser (1 meter long, ¼"diameter copper tube) only Lowers the saturation temperature difference ($\Delta T_{sat}$<1° C.) that is available ($T_{sat@evap}$−$T_{sat@cond}$~20-25° C.). Such a small change in saturation temperature will mitigate condensation in the vapor removal lines and can safely account for the slight superheating of the vapor. The liquid is then recirculated back to the constant temperature reservoir (7). Total volume of the test fluid in the loop is estimated to be ~600 mL. The liquid flow rates, pressure drops and required pumping power are detailed in Table 2. All of the measurement instruments in this setup, including thermocouples, flow and pressure sensors, will conform to the requirement for measurement errors <10%.

TABLE 2

Liquid and vapor flow rates, pressure drop, and power requirements.

| | Flow rate (cm³/sec) | Pressure drop (kPa) | Power required (mW) | Pump Model/Make |
|---|---|---|---|---|
| Liquid | 5.1 | 5-8 kPa (node (1)-(3)) | 40 mW | mzr-11508/ Micropump (0-20 mL/sec) |
| Vapor | 670 | 3-2 kPa (node (4)-(5)) | 2 W | NA* |

**driven by the sat. pressure difference between the evaporator and condenser

Under normal operating conditions, the pump only supplies the pressure required to deliver the liquid from the external reservoir (1) to the inlet manifold (3) through a series of macroscopic tubings (¼") while the capillary pumping mechanism associated with the membrane drives pentane to the heated substrate through the microfluidic network. The minimal pumping pressure of 5-8 kPa required to drive the liquid from the reservoir to the inlet manifold implies that a CoP=Q/$W_p$>100, where Q is the total thermal power dissipated from the device and $W_p$ is the power input (40 mW) of the liquid pump (mzr-11508) to supply liquid to the device.

Pentane was selected as the dielectric working fluid due to its favorable thermophysical properties such as the high latent heat and thermal conductivity, and low specific volume. While fluids such as water and methanol have significantly better thermophysical properties compared to pentane and other dielectric fluids (Table 3), they are not good dielectrics in practice because they contain dissolved ions, are good solvents, and have relatively low relaxation times, which all reduce the breakdown voltage considerably. Pentane has been investigated for electronic cooling applications [53-55] due to its non-polar and non-toxic nature, and good dielectric constant and strength of 1.84 and ~1.4 kV/mm [56], respectively. Moreover, it has significantly better thermophysical properties than typical dielectric fluids such as FC-72 and HFE7100, which is important based on our preliminary estimates to achieve the desired targets.

TABLE 3

Thermophysical and dielectric properties of liquids.

| | Latent Meat [kJ/kg] | Surface Tension [N/m] | Thermal Conductivity [W/m-K] | Vapor Specific Volume [m$^2$/kg] | Dielactric Constant | Relaxation Time [s] | Breakdown Voltage [kV/mm] |
|---|---|---|---|---|---|---|---|
| DECREASING PREFERNCE | Water [2257] | Water [0.058] | Water [0.65] | HFE7100 [0.075] | Water* [60.4] | HFE7100 [—] | HFE7100 [14] |
| | Methanol [1100] | Methanol [0.018] | Methanol [0.19] | FC-72 [0.103] | Methanol* [32.6] | FC-72 [100] | FC-72 [11] |
| | Pentane [358] | Pentane [0.014] | Pentane [0.11] | Pentane [0.335] | HFE7100 [7.38] | Pentane [10$^{-4}$] | Pentane [1.4] |
| | HFE7100 [111] | HFE7100 [0.014] | HFE7100 [0.08] | Methanol [0.811] | Pentane [1.84] | Water [10$^{-4}$] | Water [—] |
| | FC-72 [83] | FC-72 [0.000] | FC-72 [0.00] | Water [1.675] | FC-72 [1.78] | Methanol O[10$^{-11}$] | Methanol [—] |

*These values are not a good indicator of dielectric performance which should be concluded from corresponding relaxation time and experimental breakdown voltage data.

The Lower Explosive/Flammable Limit (LEL/LFL) of pentane is 1.4% [57]. Although pentane can form as explosive mixture in air, the design requirement of leak rates less than 1% per year will rule out the flammability hazard of pentane under normal operating conditions. Precautions will be taken in case of a large leak so as to minimize or eliminate any concerns with respect to fire and explosion.

The fabrication process for the SiC test device is shown in FIG. 7. First, thin film heaters to emulate the GaN device and a temperature sensor array will be fabricated on a SiC substrate. Conventional lithography will be used, where a thin Pt layer deposited using electron-beam evaporation is patterned using a metal lift-off technique (FIG. 7a). UV lithography is then carried out to create ridges on the backside of the wafer. This allows preparing features on a hard mask, such as SiO$_2$ or metal, which is subsequently used for etching SiC with reactive ion etching (RIE) [58-63] to fabricate ridges ~0.2 μm thick, spaced ~1 μm apart and ~2 μm tall [64]. A conformal deposition of silicon oxide (~2 μm) is then carried out using plasma enhanced chemical vapor deposition (PECVD) to fill the channels between the ridges. Subsequently, mechanical polishing of the substrate will result in a flat surface suitable for further processing steps, FIG. 7b. SiC is then deposited (~0.3 μm thick) using a PECVD, followed by deposition of titanium and nickel using e-beam evaporation (FIG. 7c).

Conventional lithography allows etching the nickel to produce square features ~10 to 50 μm, which define the liquid ports for the coolant supply. Subsequently, a block copolymer film is used as an etch mask to transfer nanoscale patterns (~40 nm diameter pores) in the underlying nickel metal [65-67], as shown in FIG. 7d. Using the patterned metal layer as the hard mask, the underlying SiC substrate is then etched using inductively coupled plasma enhanced RIE [63], Ni is retained on the membrane for the subsequent wafer bonding process. The membrane is released by etching the silicon oxide chemically using buffered oxide etch (BOE), leaving behind a monolithic structure, consisting of freestanding membranes supported only at the ridges, as shown in FIG. 7e.

Figure 13:
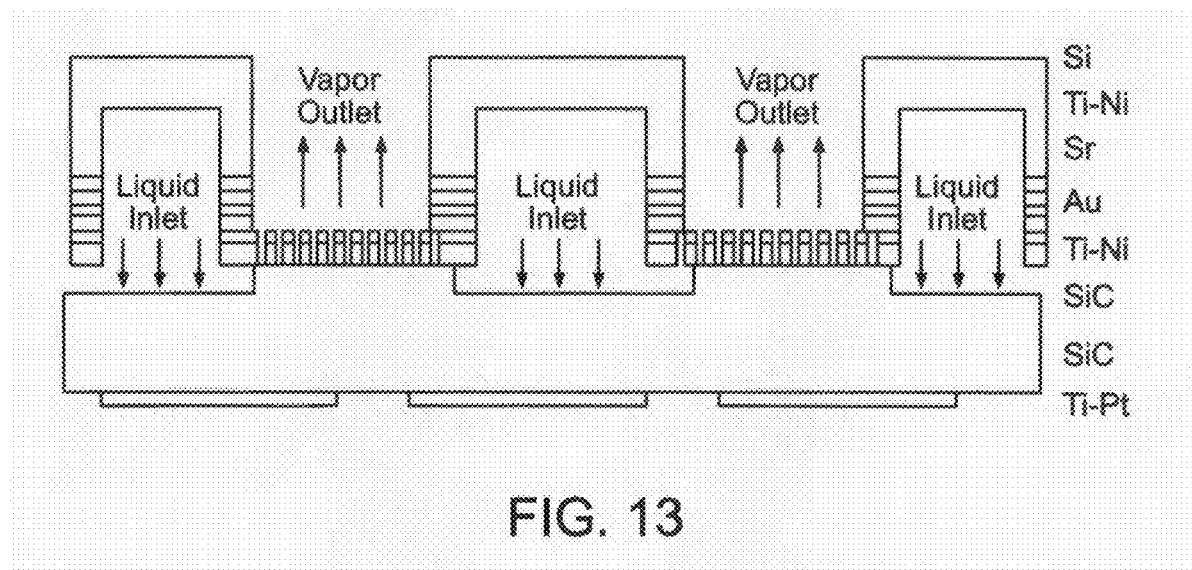
FIG. 13 is a cross-sectional view of the membrane-ridge device layer is SiC substrate bonded with the liquid-vapor microchannel device layer in Si substrate.

Microfluidic manifolds for the fluid supply and vapor removal will be separately etched and fusion bonded (not shown) in Si using well-established lithography and dry etching processes. Gold (Au)-tin (Sn) eutectic bonding will be used to join SiC substrate consisting of the membrane-ridge structure with the Si substrate consisting of the fluidic manifold. This is a crucial step to ensure hermetic sealing from the ambient environment [23]. Multiple layers of metallization Ti-100 nm, Ni-200 nm, Au-70 nm, Sn-2900 nm and then Au-80 nm, are deposited on wafer with the microfluidic manifolds (FIG. 13). Ti acts as an adhesion promoter and Ni prevents diffusion of Sn into the substrate. A thin layer of gold is also deposited onto the SiC substrate using e-beam. At 280° C., Sn diffuses into Au and forms a strong wafer-bond. Note that the thermal budget of all the fabrication steps for our proposed cooling system in the SiC wafer (T<400° C.) is compatible with SiC wafers with GaN devices already fabricated on them. Initially the membrane and ridges will be fabricated in Si due the well-established processes and expertise to demonstrate viability of the membrane approach. Meanwhile, SiC processing will be developed.

The numbers within square brackets refer to the references listed herewith. The content of all of these references is incorporated herein by reference.

It is recognized that modifications and variations of the present invention will be apparent to those of ordinary skill in the art and it is intended that all such modifications and variations be included within the scope of the appended claims.

REFERENCES

1. Bula, A. J., M. M. Rahman, and J. E. Leland, *Axial steady free surface jet impinging over a flat disk with discrete heat sources*. International Journal of Heat and Fluid Flow, 2000. 21(1): p. 11-21.
2. Mailly, F., et al., *Anemometer with hot platinum thin film*. Sensors and Actuators A: Physical, 2001. 94(1-2): p. 32-38.
3. Mudawar, I., *Assessment of high-heat-flux thermal management schemes*. IEEE Transactions on Components & Packaging Technologies, 2001. 24(2): p. 122-141.
4. Bowers, M. B. and I. Mudawar, *High-flux boiling in low-flow rate, low-pressure drop mini-channel and micro-channel heat sinks*. International Journal Of Heat And Mass Transfer, 1994. 37(2): p. 321-332.
5. Peng, X. F. and B. X. Wang, *Forced-convection and flow boiling heat-transfer for liquid flowing through micro-channels*. International Journal Of Heat And Mass Transfer, 1993. 36(14): p. 3421-3427.

6. Madou, M. J. *Fundamentals of Microfabrication: The Science of Miniaturization*, 2002. ISBN-10. 1208775268.
7. Bar-Cohen, A., J. R. Sheehan, and E. Rahim, *Two-Phase Thermal Transport in Microgap Channels-Theory, Experimental Results, and Predictive Relations*. Microgravity Science and Technology, 2012. 24(1): p. 1-15.
8. Shaw, G. A., et al., *Shape memory effect in nanoindentation of nickel-titanium thin films*. Applied physics letters, 2003. 83: p. 257.
9. Electroplating, S.a.T.N.; Available from: http://www.substech.com/dokuwiki/doku.php?id=nickel_electroplating.
10. Narayanan, S., A. G. Fedorov, and Y. K. Joshi, *Gas-Assisted Thin-Film Evaporation from Confined Spaces for Dissipation of High Heat Fluxes*. Nanoscale And Microscale Thermophysical Engineering, 2009. 13(1): p. 30-53.
11. Kerdiles, S., et. al., *Low temperature deposition of nanocrystalline silicon carbide thin films*. Applied physics letters 2000. 76: p. 2373.
12. Sarro, P., et al., *Low-stress PECVD SiC thin films for IC-compatible microstructures*. Sensors and Actuators A: Physical, 1998. 26(1-3): p. 175-180.
13. Transene Company, I. *Nickel Etchants*. Available from: http://www.transene.com/ni_etchant.html.
14. Berman, A. S., *Free molecule transmission probabilities*. J. Appl. Phys., 1965. 36: p. 3356.
15. Caupin, F. and E. Herbert, *Cavitation in water: A review*, C. R. Physique, 2006. 7: p. 1000-1017.
16. Blander, M. and J. L. Katz, *BUBBLE NUCLEATION IN LIQUIDS*. Aiche Journal, 1975 21(5): p. 833-848.
17. Carey, V. P., *Liquid-Vapor Phase-Change Phenomena*. 1992; Hemisphere Pub. Corp.
18. Ziambaras, E. and P. Hyldgaard, *Phonon Knudsen flow in nanostructured semiconductor systems*. Journal of Applied Physics, 2006. 99(5).
19. Sharpe, W. N. et al., *Fracture strength of single-crystal silicon carbide microspecimens at 24 degrees C. and 1000 degrees C*. Journal of Microelectromechanical Systems, 2008. 17(1): p. 244-254.
20. Siedel, S., et. al., *Electric field effects during nucleate boiling from an artificial nucleation site*. Experimental Thermal and Fluid Science, 2011. 35(5): p. 762-771.
21. Zaghdoudi, M. C. and M. Lallemand, *Nucleate pool boiling under DC electric field*. Experimental Heat Transfer, 2001. 14(3): p. 157-180.
22. Balygin, I., *Electric Strength of Liquid Dielectrics*, DTIC Document, 1972.
23. Wang, Q., et al., *Application of Au—Sn eutectic bonding in hermetic radio-frequency microelectromechanical system wafer level packaging*. Journal of electronic materials, 2006. 35(3): p. 425-432.
24. Lee. P.-S. and S. V. Garimella, *Saturated flow boiling heat transfer and pressure drop in silicon microchannel arrays*. International Journal of Heat and Mass Transfer, 2008. 51(3-4): p. 789-806.
25. Steinke, M. E. and S. G. Kandlikar, *An Experimental Investigation of Flow Boiling Characteristics of Water in Parallel Microchannels*. Journal of Heat Transfer 2004. 126(4): p. 518-526.
26. Lee. J. and I. Mudawar, *Two-phase flow in high-heat-flux micro-channel heat sink for refrigeration cooling applications: Part II—heat transfer characteristics*. International Journal of Heat and Mass Transfer, 2005. 48(5): p. 941-955.
27. Bar-Cohen, A., J. Sheehan and E. Rahim, *Two-Phase Thermal Transport in Microgap Channels—Theory, Experimental Results, and Predictive Relations*. Microgravity Science and Technology, 2012. 24(1) p. 1-15.
28. Shou-Shing, H. and L. Chih-Yi, *Subcooled convective boiling in structured surface microchannels*. Journal of Micromechanics and Microengineering, 2010. 20(1): p. 015027.
29. Kosar, A., C. J. Kuo, and Y. Peles, *Suppression of boiling flow oscillations in parallel microchannels by inlet restrictors*. Journal of Heat Transfer-Transactions of the Asme, 2006. 128(3): p. 251-260.
30. Kim, S. S., et al., *Thermal Performance of Carbon Nanotube Enhanced Vapor Chamber Wicks*. ASME Conference Proceedings, 2010. 2010(49408): p. 417-424.
31. Changsong, D., et al., *A Flat Heat Pipe Architecture Based on Nanostructured Titania*. Microelectromechanical Systems, Journal of, 2010. 19(4): p. 878-884.
32. Nam, Y., et. al., *Characterization and Modeling of the Heat Transfer Performance of Nanostructured Cu Micropost Wicks*. Journal of Heat Transfer, 2011. 133(10); p. 101502-7.
33. Hwang, G. S., et al., *Multi-artery heat pipe spreader: Experiment*. International Journal of Heat and Mass Transfer, 2010. 53(13-14): p. 2662-2669.
34. Ćoso, D., et al., *Enhanced Heat Transfer in Biporous Wicks in the Thin Liquid Film Evaporation and Boiling Regimes*. Journal of Heat Transfer, 2012. 134: p. 101501.
35. Cai, Q. and C.-L. Chen, *Design and Test of Carbon Nanotube Biwick Structure for High-Heat-Flux Phase Change Heat Transfer*. Journal of Heat Transfer, 2010. 132(5); p. 052403-8.
36. Narayanan, S., A. G. Fedorov, and Y. K. Joshi, *Experimental characterization of a micro-scale thin film evaporative cooling device*. in *Thermal and Thermomechanical Phenomena in Electronic Systems (Itherm)*, 2010 12th IEEE Intersociety Conference on. 2010.
37. Khan, F. A. and I. Adesida, *High rate etching of SiC using inductively coupled plasma reactive ion etching in SF6-based gas mixtures*. Applied Physics Letters, 1999. 75(15): p. 2268-2270.
38. Shah, R. K. and A. L. London, *Laminar flow forced convection in ducts*. Advance in heat Transfer, Supplement 1. 1978, New York: Academic Press.
39. Xiao, R., S. C. Maroo, and E. N. Wang. *Thin Film Evaporation Using Nanoporous Membranes for Enhanced Heat Transfer*. in *ASME Summer Heat Transfer Conference*. 2012. Puerto Rico.
40. Incropera, F. P. and D. P. DeWitt, *Fundamentals of Heat and Mass Transfer*. 4 ed. 1996, New York: John Wiley and Sons.
41. Ziambaras, E. and P. Hyldgaard, *Phonon Knudsen flow in nanostructured semiconductor systems*. Journal of Applied Physics, 2006. 99(5): p. 054303-11.
42. Hopcroft, M. A., W. D. Nix, and T. W. Kenny, *What is the Young'Modulus of Silicon?* Microelectromechanical Systems, Journal of, 2010. 19(2): p. 229-238.
43. Wu, J. D., C. Y. Huang, and C. C. Liao, *Fracture strength characterization and failure analysis of silicon dies*. Microelectronics Reliability, 2003. 43(2): p. 269-277.
44. http://www.memsnet.org/material/siliconcarbidesicbulk/.
45. Sharpe, W. N., Jr., et al. *Fracture strength of silicon carbide microspecimens*. Microelectromechanical Systems. Journal of, 2005. 14(5): p. 903-913.

46. Schrage, R. W., *A theorectical study of interphase mass transfer*. 1953, New York: Columbia University Press.
47. Fang, G. and C. A. Ward, *Expression for predicting liquid evaporation flux: Statistical rate theory approach*. Phys. Rev. E, 1999. 59(1): p. 429-440.
48. Xiao, R., S. C. Maroo, and E. N. Wang. *Thin Film Evaporation Using Nanoporous Membranes for Enahnced Heat Transfer*. in *ASME 2012 Summer Heat Transfer Conference*. 2012.
49. Bonacci, J. C., et al., *The evaporation and condensation coefficient of water, ice and carbon tetrachloride*. Chemical Engineering Science, 1976. 31(8): p. 609-617.
50. Maa, J. R., *Evaporation Coefficient of Liquids*. Industrial & Engineering Chemistry Fundamentals, 1967. 6(4): p. 504-518.
51. Marek, R. and J. Straub, *Analysis of the evaporation coefficient and the condensation coefficient of water*. International Journal of Heat and Mass Transfer, 2001. 44(1): p. 39-53.
52. Paul B., *Compilation of Evaporation Coefficients*. American Rocket Society Journal, 1962. 32: p. 1321.
53. Bailey, W., et al. *Pool boiling study on candidature of pentane, methanol and water for Near room temperature cooling*. 2006. Thermal and Thermomechanical Phenomena in Electronic Systems, 2006. ITHERM '06: IEEE.
54. Siedel, S., et al., *Electric field effects during nucleate boiling from an artificial nucleation site*. Experimental Thermal and Fluid Science, 2010.
55. Zaghdoudi, M. and M. Lallemand, *Nucleate pool boiling under DC electric field*. Experimental heat transfer, 2001. 14(3): p. 157-180.
56. Balygin, I., *Electric Strength of Liquid Dielectrics*, 1972, DTIC Document.
57. Zhao, Y. H., et al., *Conjugated heat transfer an a horizontal surface impinged by circular free-surface liquid jet*. Jsme International Journal Series B-Fluids and Thermal Engineering, 2002. 45(2): p. 307-314.
58. Beheim, G. and C. S. Salupo. *Deep RIE process for silicon carbide power electronics and MEMS*. 2000: Cambridge Univ Press.
59. Padiyath, R., et al., *Reactive ion etching of monocrystalline, polycrystalline, and amorphous silicon carbide in CF4/O2 mixtures*. Applied physics letters, 1991. 58(10): p. 1053-1055.
60. Richter, C., et al., *Rapid plasma etching of cubic SiC using NF3/O2 gas mixtures*. Materials Science and Engineering: B, 1997. 46(1-3): p. 160-163.
61. Sugiura, J., et al., *Reactive ion etching of SiC thin films using fluorinated gases*. Journal of Vacuum Science & Technology B: Microelectronics and Nanometer Structures, 1986. 4(1): p. 349-354.
62. Wu, B., A. Kumar, and S. Pamarthy, *High aspect ration silicon etch: A review*. Journal of Applied Physics, 2010. 108(5): p. 051101.
63. Okamoto, N., et. al., *SiC backside via-hole process for GaN HEMT MMICs using high etch rate ICP etching*. 2009.
64. Jordana, E., *Deep-UV lithography fabrication of slot waveguides and sandwiched waveguides for nonlinear applications*. 2007: IEEE.
65. Qiao, Y., D. Wang, and J. M. Buriak, *Block copolymer templated etching on silicon*. Nano Letters, 2007. 7(2): p. 464-469.
66. Popa, A. M., et. al., *Fabrication of nanopore arrays and ultrathin silicon nitride Membranes by block-copolymer-assisted lithography*. Nanotechnology, 2009. 20: p. 485303.
67. Segalman, R. A., *Patterning with block copolymer thin films*. Materials Science and Engineering: R: Reports, 2005. 48(6): p. 191-226.
68. Basavanhally, N. and D. Marom, *Method and Apparatus for Controlling Curvatures of Microlenses and Micromirrors*. Jan. 19, 2010.
69. Faghri, A., *Heat Pipe Science and Technology*, 1995, New York: Taylor and Francis.
70. Anderson Jr., J. D., *Fundamentals of Aerodynamics*. Aerospace Science Series. 1991, New York: McGraw-Hill, Inc.
71. Osuga, T., H. Sakamoto, and T. Takagi, *Hydrodynamic analysis of electroosmotic flow in capillary*. Journal of the Physical Society of Japan, 1996. 65(6): p. 1854-1858.
72. Frangis, N., et al., *The formation of 3C-SiC in crystalline Si by carbon implantation at 950° C. and annealing—a structural study*. Journal of Crystal Growth, 1997. 181: p. 218-228.
73. Xiao, R., K. H. Chu, and E. N. Wang, *High-flux Thin Film Evaporation on Nanostructured Surfaces*, in *Proceedings of the International Heat Transfer Conference*. 2010. Washington, D.C.
74. Masuda, H. and K. Fukuda, *Ordered Metal Nanohole Arrays Made by a Two-Step Replication of Honeycomb Structures of Anodic Alumina*. Science, 1995. 268: p. 1466-1468.
75. Heyderman, L., et al., *High volume fabrication of customised nanopore membrane chips*. Microelectronic engineering, 2003. 67: p. 208-213.
76. Wang, E. N. et al., *A Hybrid Method for Bubble Geometry Reconstruction in Two-Phase Microchannels*. Experiments in Fluids 2006. 40(6): p. 847-858.
77. Wang, E. N. et al., *Nucleation and Growth of Vapor Bubbles in a Heated Silicon Microchannel*. Journal of Heat Transfer, 2004. 128(4): p. 497.
78. Zhang, L., et al. *Enhanced Nucleate Boiling in Microchannels*. in *Fifteenth IEEE International Conference on Micro Electro Mechanical Systems*. 2002. Las Vegas, Nev., U.S.A.
79. Alexander, B. R. and E. N. Wang, *Design of a Microbreather for Two-Phase Microchannel Heat Sinks*. Nanoscale And Microscale Thermophysical Engineering, 2009. 13(3): p. 151-164.
80. Xiao, R., R. Enright, and E. N. Wang, *Prediction and Optimization of Liquid Propagation in Micropillar Arrays*. Langmuir, 2010. 26(19): p. 15070-15075.
81. Xiao, R. and E. N. Wang, *Microscale Liquid Dynamics and the Effect on Macroscale Propagation in Pillar Arrays*. Langmuir, 2011. 27(17): p. 10360-10364.
82. Xiao, R., K. H. Chu, and E. N. Wang, *Multilayer liquid spreading on superhydrophilic nanostructured surfaces*. Applied Physics Letters 2009. 94(19).
83. Chu, K. H., R. Xiao, and E. N. Wang, *Uni-directional spreading on asymmetric nanostructured surfaces*. Nature Materials, 2010. 9: p. 413-417.
84. Wang, E. N., et al., *Micromachined Jets for Liquid Impingement of VLSI Chips*. Journal of MicroElectroMechanical Systems, 2004. 13(5): p. 833-842.
85. Chu, K. H., R. Enright, and E. N. Wang, *Structured surfaces for enhanced pool boling heat transfer*. Applied Physics Letters, 2012(100): p. 241603.

86. Miljkovic, N., R. Enright, and E. N. Wang, *Effect of Droplet Morphology on Growth Dynamics and Heat Transfer during Condensation on Superhydrophobic Nanostructured Surfaces.* ACS Nano, 2012. 6(2): p. 1776-1785.
87. Chung, J. W., et al., *Seamless On-Wafer Integration of Si(100) MOSFETs and GaN HEMTs.* Electron Device Letters, 2009. 30(10): p. 1015-1017.
88. Lu, B., and T. Palacios, *High Breakdown (>1500 V) AlGaN/GaN HEMTs by Substrate-Transfer Technology.* Electron Device Letters, 2010. 31(9): p. 951-953.
89. Ryu, K. K., et al., *Thin-Body N-Face GaN Transistor Fabricated by Direct Wafer Bonding.* Electron Device Letters, 2011. 32(7): p. 895-897.
90. Lee, H.-S., K. Ryu, and M. Sun, *Wafer-Level Heterogeneous Integration of GaN HEMTs and Si (100) MOSFETs.* Electron Device Letters, 2012. 33(2): p. 200-202.
91. Ahuja, A., et al., *Nanonails: A simple geometrical approach to electrically tunable superlyophobic surfaces.* Langmuir, 2008. 24(1): p. 9-14.
92. Lobaton, E. J. and T. R. Salamon, *Computation of Constant Mean Curvature Surfaces: Application to the Gas-Liquid Interface of a Pressurized Fluid on a Superhydrophobic Surface.* Journal of Colloid and Interface Science, 2007. 314(1): p. 184-198.
93. Annapragada, S. R., et al., *Determination of electrical contact resistivity in thermoelectric modules (TEMs) from module-level measurements.* IEEE Trans. Comp. Pack. Tech, 2012. 2(4): p. 668-676.
94 Kumari, N., et al., *Analysis of Evaporating Mist Flow for Enhanced Convective Heat Transfer.* International Journal Of Heat And Mass Transfer, 2010. 53: p. 3346-3356.

What is claimed is:

1. Evaporative heat transfer system comprising:
a substrate;
a plurality of parallel, spaced-apart ridges extending from the substrate forming vertical liquid manifolds therebetween;
a nanoporous membrane wetted by a dielectric fluid with approximately a zero contact angle and having a thickness of approximately 300 nm supported on the ridges, the nanoporous membrane including pores having a pore size of approximately 40 nm to provide high capillary pressures; and
a pump for delivering the dielectric fluid across the ridges, whereby the fluid is drawn through the vertical liquid manifolds via capillarity provided by the nanoporous membrane and evaporates to dissipate heat flux through the substrate.

2. The system of claim 1 wherein the dielectric fluid is pentane.

3. The system of claim 1 wherein pore size in the nanoporous membrane is selected to provide high capillary pressures.

4. The system of claim 1 wherein membrane porosity varies across the membrane to tailor thermal resistances to limit temperature rises.

5. The system of claim 1 wherein the system is configured to dissipate greater than 1 $kW/cm^2$ on a 1 $cm^2$ area having a 200 by 200 µm hotspot dissipating greater than 5 $kW/cm^2$.

6. The system of claim 1 further including a condenser to capture vapor and recirculate liquid to the pump.

7. The system of claim 1 wherein the substrate is SiC.

* * * * *